(12) United States Patent
Takemura et al.

(10) Patent No.: US 8,164,163 B2
(45) Date of Patent: Apr. 24, 2012

(54) SEMICONDUCTOR DEVICE HAVING SEALING RING

(75) Inventors: Koji Takemura, Osaka (JP); Hiroshige Hirano, Nara (JP); Yutaka Itoh, Kyoto (JP); Hikari Sano, Hyogo (JP); Koji Koike, Osaka (JP)

(73) Assignee: Panasonic Corporation, Osaka (JP)

( * ) Notice: Subject to any disclaimer, the term of this patent is extended or adjusted under 35 U.S.C. 154(b) by 229 days.

(21) Appl. No.: 12/029,969

(22) Filed: Feb. 12, 2008

(65) Prior Publication Data

US 2008/0258266 A1 Oct. 23, 2008

(30) Foreign Application Priority Data

Apr. 19, 2007 (JP) ................. 2007-110777

(51) Int. Cl.
*H01L 23/544* (2006.01)

(52) U.S. Cl. ................. 257/620; 257/E23.194

(58) Field of Classification Search ............ 257/620, 257/730, 758, E23.194, 508
See application file for complete search history.

(56) References Cited

U.S. PATENT DOCUMENTS

| 5,861,658 | A  | * | 1/1999  | Cronin et al. | ......... 257/499 |
| 6,566,736 | B1 | * | 5/2003  | Ogawa et al. | ......... 257/620 |
| 2004/0150070 | A1 | * | 8/2004  | Okada et al. | ......... 257/508 |
| 2005/0098893 | A1 | * | 5/2005  | Tsutsue et al. | ......... 257/758 |
| 2005/0269702 | A1 | * | 12/2005 | Otsuka | ......... 257/750 |
| 2005/0280120 | A1 | * | 12/2005 | Tomita | ......... 257/620 |
| 2007/0158788 | A1 | * | 7/2007  | Yang | ......... 257/620 |
| 2008/0157284 | A1 | * | 7/2008  | Chang et al. | ......... 257/620 |

FOREIGN PATENT DOCUMENTS

JP 2005-167198 6/2005

\* cited by examiner

*Primary Examiner* — Wael Fahmy
*Assistant Examiner* — Sarah Salerno
(74) *Attorney, Agent, or Firm* — McDermott Will & Emery LLP

(57) ABSTRACT

A semiconductor device includes: an interlayer insulating film formed on a substrate; a wiring formed in the interlayer insulating film in a chip region of the substrate; a seal ring formed in the interlayer insulating film in a periphery of the chip region and continuously surrounding the chip region; and a first protective film formed on the interlayer insulating film having the wiring and the seal ring formed therein. A first opening is formed in the first protective film in a region located outside the seal ring when viewed from the chip region, and the interlayer insulating film is exposed in the first opening.

27 Claims, 18 Drawing Sheets

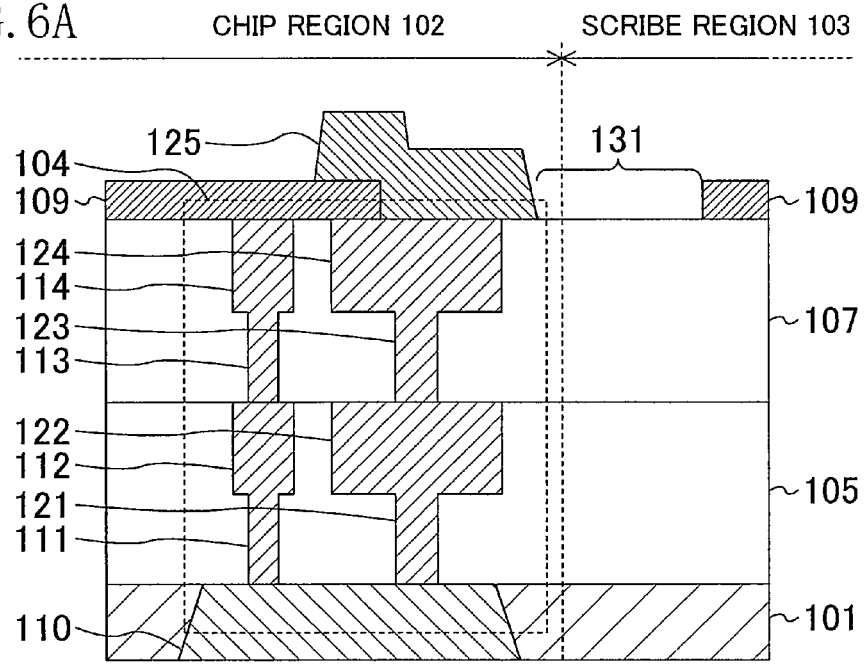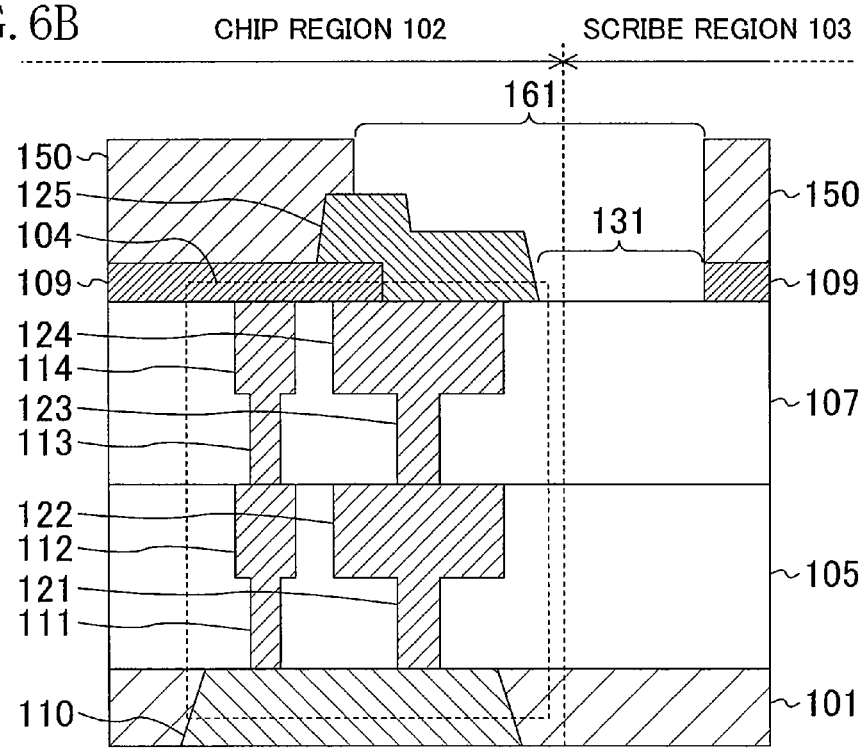

SEMICONDUCTOR DEVICE HAVING SEALING RING

BACKGROUND OF THE INVENTION

1. Field of the Invention

The invention relates to a semiconductor device having a seal ring surrounding a chip region and a manufacturing method thereof.

2. Background Art

A semiconductor device is commonly manufactured by arranging a multiplicity of ICs (integrated circuits), each formed by a plurality of elements and having a prescribed function, in a matrix pattern on a semiconductor wafer such as silicon.

A multiplicity of chip regions on a wafer are separated from each other by a grid-like scribe region (a grid-like scribe line). After a multiplicity of chip regions are formed on a wafer by a semiconductor manufacturing process, the wafer is diced into individual chips along the scribe region, whereby semiconductor devices are formed.

When the wafer is diced into individual chips, chip regions near the scribe line may be subjected to mechanical impact, and the diced cross sections of the separated chips, that is, the separated semiconductor devices, may be partially cracked or chipped.

In order to solve this problem, Patent document 1 proposes a technology of providing a seal ring, a ring-shaped protective wall, in the periphery of each chip region to prevent cracks from spreading in the chip region in a dicing process.

FIG. 22 shows a cross-sectional structure of a conventional semiconductor device having a seal ring (a semiconductor device formed in a wafer).

As shown in FIG. 22, a substrate 1 of a wafer has chip regions 2 divided by a scribe region 3. A layered structure of a plurality of interlayer insulating films 5 through 10 is formed on the substrate 1. An active layer 20 that forms an element is formed in the chip region 2 of the substrate 1. A plug (via) 21 connecting to the active region 20 is formed in the interlayer insulating film 5. A wiring 22 connecting to the plug 21 is formed in the interlayer insulating film 6. A plug 23 connecting to the wiring 22 is formed in the interlayer insulating film 7. A wiring 24 connecting to the plug 23 is formed in the interlayer insulating film 8. A plug 25 connecting to the wiring 24 is formed in the interlayer insulating film 9. A wiring 26 connecting to the plug 25 is formed in the interlayer insulating film 10.

As shown in FIG. 22, a seal ring 4 is formed in the layered structure of the plurality of interlayer insulating films 5 through 10 in the periphery of the chip region 2. The seal ring 4 extends through the layered structure and continuously surrounds the chip region 2. As shown in, for example, Patent document 1, the seal ring 4 is formed by alternately forming a wiring formation mask and a via formation mask. More specifically, the seal ring 4 are formed by an electrically conductive layer 30, a seal via 31, a seal wiring 32, a seal via 33, a seal wiring 34, a seal via 35, and a seal wiring 36. The electrically conductive layer 30 is formed in the substrate 1. The seal via 31 is formed in the interlayer insulating film 5 and connects to the electrically conductive layer 30. The seal wiring 32 is formed in the interlayer insulating film 6 and connects to the seal via 31. The seal via 33 is formed in the interlayer insulating film 7 and connects to the seal wiring 32. The seal wiring 34 is formed in the interlayer insulating film 8 and connects to the seal via 33. The seal via 35 is formed in the interlayer insulating film 9 and connects to the seal wiring 34. The seal wiring 36 is formed in the interlayer insulating film 10 and connects to the seal via 35. A portion of the seal ring which is formed by a wiring formation mask is herein referred to as a seal wiring, and a portion of the seal ring which is formed by a via formation mask is herein referred to as a seal via.

As shown in FIG. 22, a passivation film 11 is formed on the layered structure of the interlayer insulating films 5 through 10 having the wirings (22, 24, 26), the vias (21, 23, 25), and the seal ring 4 formed therein. The passivation film 11 has an opening on the wiring 26. A pad 27 connecting to the wiring 26 is formed in the opening. The passivation film 11 has another opening on the seal wiring 36. A cap layer 57 connecting to the seal wiring 36 is formed in this opening.

Patent document 1: Japanese Laid-Open Patent Publication No. 2005-167198

SUMMARY OF THE INVENTION

In a conventional semiconductor device, a passivation film peels from a substrate due to impact caused in a wafer dicing process, or this impact may transmit into the chip region through the passivation film.

More specifically, in the semiconductor device of Patent document 1, the passivation film on the seal ring has an opening and the cap layer for preventing corrosion of the seal ring is formed in the opening. In this structure, the passivation film is separated on the seal ring. In other words, the passivation film is separated between the inside and outside of the chip region. However, the separated passivation films are physically connected to each other through the cap layer. The passivation film is made of a material (e.g., SiN (silicon nitride)) that is harder and more brittle than TEOS (tetraethylorthosilicate) that is used for the interlayer insulating films and the like. Therefore, the passivation film cannot sufficiently prevent impact, cracks, and the like from spreading from the outside toward the inside of the chip region.

In view of the above problems, it is an object of the invention to prevent chippings, cracks, and the like produced in the side surface of a chip (a semiconductor device) in a dicing process (a process of dividing a wafer into individual chips) from spreading into a chip region, and thus to prevent degradation of reliability and moisture resistance of a semiconductor device.

In order to achieve the above object, a semiconductor device according to a first aspect of the invention includes: an interlayer insulating film formed on a substrate; a wiring formed in the interlayer insulating film in a chip region of the substrate; a seal ring formed in the interlayer insulating film in a periphery of the chip region and continuously surrounding the chip region; and a first protective film formed on the interlayer insulating film having the wiring and the seal ring formed therein. A first opening is formed in the first protective film in a region located outside the seal ring when viewed from the chip region, and the interlayer insulating film is exposed in the first opening.

According to the semiconductor device of the first aspect of the invention, the first protective film such as a passivation film is separated by the first opening in a region outside the seal ring (near the periphery of the chip region). Therefore, even when the first protective film located outside of the chip region peels from the substrate by the impact caused by dicing of a wafer, the first protective film in the chip region can be prevented from peeling from the substrate. The interlayer insulating film is exposed in the first opening that separates the first protective film between the inside and outside of the chip region. Therefore, the impact applied to the first protective film outside the chip region can be more reliably prevented from transmitting through the first protective film into the chip region, as compared to the structure in which a cap layer or the like is formed in the first opening. Accordingly, chippings, cracks, and the like that are produced by dicing the wafer into individual chips can be prevented from spreading into the chip region. As a result, degradation of reliability and moisture resistance of the semiconductor device can be prevented.

The semiconductor device according to the first aspect of the invention (and also a semiconductor device according to a second aspect of the invention described below) refers to a diced chip. Note that this chip herein includes a chip region and a dicing residue (a portion adjacent to the chip region) of a scribe region in a wafer state. Accordingly, the first opening in the first protective film may be formed not only on the end portion of the chip region located outside the seal ring but on the dicing residue of the scribe region. The first opening may be formed by not forming the first protective film in the scribe region in the wafer state. In the semiconductor device according to the first aspect of the invention (and also the semiconductor device according to the second aspect of the invention described below), the seal ring is covered by at least one of the first protective film or a cap layer described below (the cap layer is formed in another opening or in a part of the first opening). Therefore, the seal ring will not be corroded.

In the semiconductor device of the first aspect of the invention, it is preferable that a groove is formed in the exposed portion of the interlayer insulating film.

A transmission path of the impact, stress, and the like from the outside of the chip region toward the inside of the chip region in the dicing process of the wafer can be blocked by forming a groove in the exposed portion of the interlayer insulating film. Therefore, degradation in reliability and moisture resistance of the semiconductor device can be more reliably prevented.

In the semiconductor device of the first aspect of the invention, it is preferable that the first opening extends to a position on the seal ring, and that a cap layer connecting to the seal ring is formed in the first opening in a region on the seal ring.

In this case, transmission of impact, stress, and the like from the outside of the chip region toward the inside of the chip region in the dicing process of the wafer can be blocked by the cap layer and the seal ring having toughness and malleability. Therefore, the first protective film in the chip region can be more reliably prevented from peeling from the substrate. As a result, reliability and moisture resistance of the semiconductor device can further be improved. In this case, the cap layer and the exposed portion of the interlayer insulating film may be located adjacent to each other.

In the semiconductor device of the first aspect of the invention, it is preferable that a second opening is formed in the first protective film in a region on the seal ring, and that a cap layer connecting to the seal ring is formed in the second opening.

In this case, transmission of impact, stress, and the like from the outside of the chip region toward the inside of the chip region in the dicing process of the wafer can be blocked by the cap layer and the seal ring having toughness and malleability. Therefore, the first protective film in the chip region can be more reliably prevented from peeling from the substrate. As a result, reliability and moisture resistance of the semiconductor device can further be improved. A sidewall spacer made of a same material as a material of the cap layer may be formed on a side surface of the first protective film located between the first opening and the second opening, a side surface of the first protective film facing the first opening. In this case, stress generated by the impact caused by dicing of the wafer can be prevented from being intensively applied to the side surface of the first protective film in the chip region (the side surface facing the first opening). Accordingly, the first protective film in the chip region can be more reliably prevented from peeling from the substrate. A bottom surface of the sidewall spacer may be located lower than a bottom surface of the first protective film. A surface of the exposed portion of the interlayer insulating film may be located lower than a bottom surface of the sidewall spacer. In other words, a groove may be formed in the exposed portion of the interlayer insulating film. In this case, a transmission path of the impact, stress, and the like from the outside of the chip region toward the inside of the chip region in the dicing process of the wafer can be blocked. Therefore, degradation in reliability and moisture resistance of the semiconductor device can be more reliably prevented.

In the semiconductor device of the first aspect of the invention, it is preferable that a cap layer is formed so as to cover an end portion of the first protective film located on a side of the chip region when viewed from the first opening.

In this case, stress generated by the impact caused by dicing of the wafer can be prevented from being intensively applied to the side surface of the first protective film in the chip region (the side surface facing the first opening). Accordingly, the first protective film in the chip region can be more reliably prevented from peeling from the substrate. The cap layer may peel from the substrate in the case where the seal ring is covered by the first protective film. Another cap layer may be formed so as to cover an end portion of the first protective film located on an opposite side to the chip region when viewed from the first opening.

In the semiconductor device of the first aspect of the invention, a pad opening may be formed in the first protective film in a region on the wiring, and a pad connecting to the wiring may be formed in the pad opening.

In the semiconductor device of the first aspect of the invention, a top layer wiring 0opening may be formed in the first protective film in a region on the wiring, and a top layer wiring connecting to the wiring may be formed in the top layer wiring opening. In this case, a second protective film may be formed on the first protective film so as to cover the top layer wiring, and a third opening may be formed in the second protective film in a region above the first opening.

In the semiconductor device of the first aspect of the invention, in the case where the second protective film is formed on the first protective film so as to cover the top layer wiring, it is preferable that an end portion of the first protective film located on an opposite side to the chip region when viewed from the first opening is not aligned with an end portion of the second protective film located on an opposite side to the chip region when viewed from the third opening, in order to facilitate etching of the second protective film that is formed with a uniform thickness and a smooth surface. In this case, the end portion of the second protective film located on the opposite side to the chip region when viewed from the third opening may be located above the first protective film located on the opposite side to the chip region when viewed from the first opening. Alternatively, the end portion of the first protective film located on the opposite side to the chip region when viewed from the first opening may be located under the second protective film located on the opposite side to the chip region when viewed from the third opening.

In order to achieve the above object of the invention, a semiconductor device according to a second aspect of the invention includes: an interlayer insulating film formed on a substrate; a wiring formed in the interlayer insulating film in a chip region of the substrate; a seal ring formed in the interlayer insulating film in a periphery of the chip region and continuously surrounding the chip region; and a first protective film formed on the interlayer insulating film having the wiring and the seal ring formed therein. The first protective film is thinned in a region located outside the seal ring when viewed from the chip region, and the thinned portion of the first protective film is exposed.

In the semiconductor device of the second aspect of the invention, the first protective film such as a passivation film is thinned in the region outside the seal ring (near the periphery of the chip region). Therefore, even when the first protective film located outside the chip region peels from the substrate by the impact caused by dicing of the wafer, this peeling of the first protective film can be terminated in the thinned portion of the first protective film. Therefore, the first protective film in the chip region can be prevented from peeling from the substrate. The first protective film serves as a transmission path of the impact, stress, and the like from the outside toward inside of the chip region 102 in the dicing process of the wafer. Therefore, by thinning the first protective film in the region outside the seal ring, transmission of the impact, stress, and the like can be blocked by the thinned portion. Accordingly, chippings, cracks, and the like that are produced by dicing the wafer into individual chips can be prevented from spreading into the chip region. As a result, degradation of reliability and moisture resistance of the semiconductor device can be prevented.

In the semiconductor device of the first or second aspect of the invention, it is preferable that the first protective film has a thickness of at least 150 nm in order to reliably protect the chip region.

In the semiconductor device of the first or second aspect of the invention, the seal ring may be made of, for example, at least one of tungsten (W), aluminum (Al), and copper (Cu).

In the semiconductor device of the first or second aspect of the invention, the first protective film may be made of, for example, silicon nitride (SiN).

In the semiconductor device of the first or second aspect of the invention, in the case where a cap layer is formed on the seal ring or the like, corrosion of the seal ring (especially the seal ring made of Cu) can be reliably prevented by forming the cap layer made of, for example, Al.

In order to achieve the above object of the invention, a manufacturing method of a semiconductor device according to a third aspect of the invention includes the steps of: (a) forming an interlayer insulating film on a substrate; (b) forming a wiring in the interlayer insulating film in a chip region of the substrate and forming a seal ring in the interlayer insulating film in a periphery of the chip region so that the seal ring continuously surrounds the chip region; (c) forming a first protective film on the interlayer insulating film having the wiring and the seal ring formed therein; and (d) forming a first opening in the first protective film in a region located outside the seal ring when viewed from the chip region so that the interlayer insulating film is exposed in the first opening.

The manufacturing method of the third aspect of the invention is a method for manufacturing the semiconductor device of the first aspect of the invention described above. Therefore, the same effects as those obtained by the semiconductor device of the first aspect of the invention can be obtained.

In the manufacturing method of the third aspect of the invention, it is preferable that the step (d) includes the step of forming a groove in the exposed portion of the interlayer insulating film.

A transmission path of the impact, stress, and the like from the outside toward inside of the chip region in the dicing process of the wafer can be blocked by forming a groove in the exposed portion of the interlayer insulating film. Therefore, degradation in reliability and moisture resistance of the semiconductor device can be reliably prevented.

In the manufacturing method of the third aspect of the invention, it is preferable that the step (d) includes the step of forming the first opening to the seal ring and that the method further includes the step of: (e) after the step (d), forming a cap layer connecting to the seal ring in the first opening in a region on the seal ring.

In this case, transmission of impact, stress, and the like from the outside of the chip region toward the inside of the chip region in the dicing process of the wafer can be blocked by the cap layer and the seal ring having toughness and malleability. Therefore, the first protective film in the chip region can be more reliably prevented from peeling from the substrate. As a result, reliability and moisture resistance of the semiconductor device can further be improved.

In the manufacturing method of the third aspect of the invention, it is preferable that the step (d) includes the step of forming a second opening in the first protective film in a region on the seal ring, and that the method further includes the step of: (e) after the step (d), forming a cap layer connecting to the seal ring in the second opening.

In this case, transmission of impact, stress, and the like from the outside of the chip region toward the inside of the chip region in the dicing process of the wafer can be blocked by the cap layer and the seal ring having toughness and malleability. Therefore, the first protective film in the chip region can be more reliably prevented from peeling from the substrate. As a result, reliability and moisture resistance of the semiconductor device can further be improved. In this case, the step (e) may include the step of forming a sidewall spacer made of a same material as a material of the cap layer on a side surface of the first protective film located between the first opening and the second opening, the side surface of the first protective film facing the first opening. In this case, stress generated by the impact caused by dicing of the wafer can be prevented from being intensively applied to the side surface of the first protective film in the chip region (the side surface facing the first opening). Accordingly, the first protective film in the chip region can be more reliably prevented from peeling from the substrate.

In the case where the manufacturing method of the third aspect of the invention further include the step (e), the manufacturing method may further include the steps of: (f) after the step (e), forming a second protective film on the first protective film; and (g) forming a third opening in the second protective film in a region above the first opening. The step (g) may include the step of forming a groove in the exposed portion of the interlayer insulating film. In this case, a transmission path of the impact, stress, and the like from the outside toward inside of the chip region in the dicing process of the wafer can be blocked. Therefore, degradation in reliability and moisture resistance of the semiconductor device can be more reliably prevented.

Preferably, the manufacturing method according to the third aspect of the invention further includes the step of: between the steps (c) and (d), forming a second opening in the first protective film in a region on the seal ring, forming in the second opening a cap layer connecting to the seal ring, and then forming a second protective film on the first protective film. The step (d) preferably includes the step of forming a third opening in the second protective film in a region located outside the seal ring when viewed from the chip region, and then forming the first opening in the first protective film in a region under the third opening.

In this case, transmission of impact, stress, and the like from the outside of the chip region toward the inside of the chip region in the dicing process of the wafer can be blocked by the cap layer and the seal ring having toughness and malleability. Therefore, the first protective film in the chip region can be more reliably prevented from peeling from the substrate. As a result, reliability and moisture resistance of the semiconductor device can further be improved.

In order to achieve the above object of the invention, a manufacturing method of a semiconductor device according to a fourth aspect of the invention includes the steps of: forming an interlayer insulating film on a substrate; forming a wiring in the interlayer insulating film in a chip region of the substrate and forming a seal ring in the interlayer insulating film in a periphery of the chip region so that the seal ring continuously surrounds the chip region; forming a first protective film on the interlayer insulating film having the wiring and the seal ring formed therein; and thinning the first protective film in a region located outside the seal ring when viewed from the chip region.

The manufacturing method of the fourth aspect of the invention is a method for manufacturing the semiconductor device of the second aspect of the invention described above. Therefore, the same effects as those obtained by the semiconductor device of the second aspect of the invention can be obtained.

As has been described above, the invention relates to a semiconductor device having a seal ring surrounding a chip region and a manufacturing method thereof. The invention is very useful because the invention is capable of preventing chippings, cracks, and the like produced in the side surface of a chip (a semiconductor device) in a dicing process (a process of dividing a wafer into individual chips) from spreading into a chip region, and thus capable of preventing degradation in reliability and moisture resistance of a semiconductor device.

BRIEF DESCRIPTION OF THE DRAWINGS

FIGS. 6A and 6B are cross-sectional views illustrating the steps of the manufacturing method of a semiconductor device according to the first embodiment of the invention;

DETAILED DESCRIPTION OF THE PREFERRED EMBODIMENTS

Figure 1:
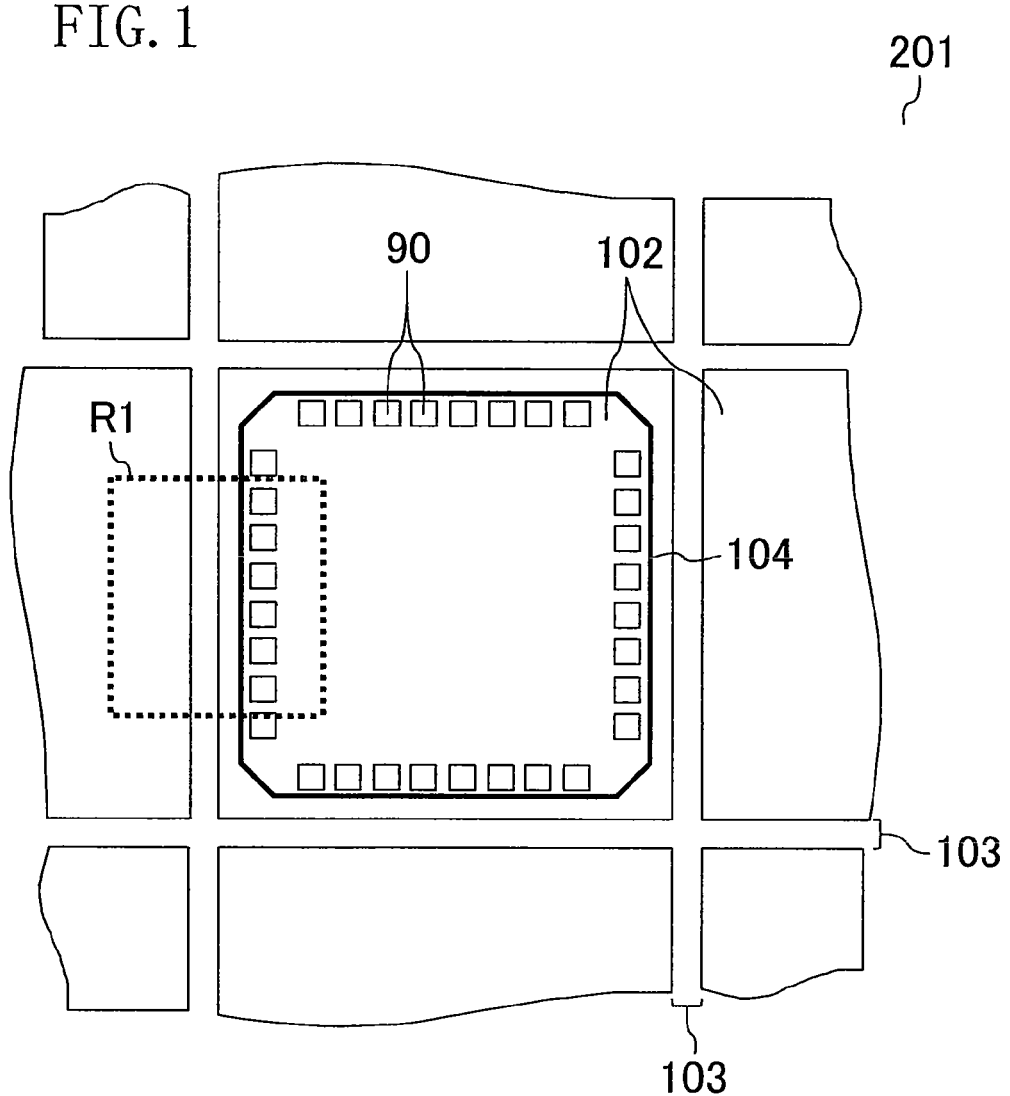
FIG. 1 is a plan view of a part of a wafer having a semiconductor device according to first, second, and third embodiments (including their modifications) of the invention.
Figure 2:
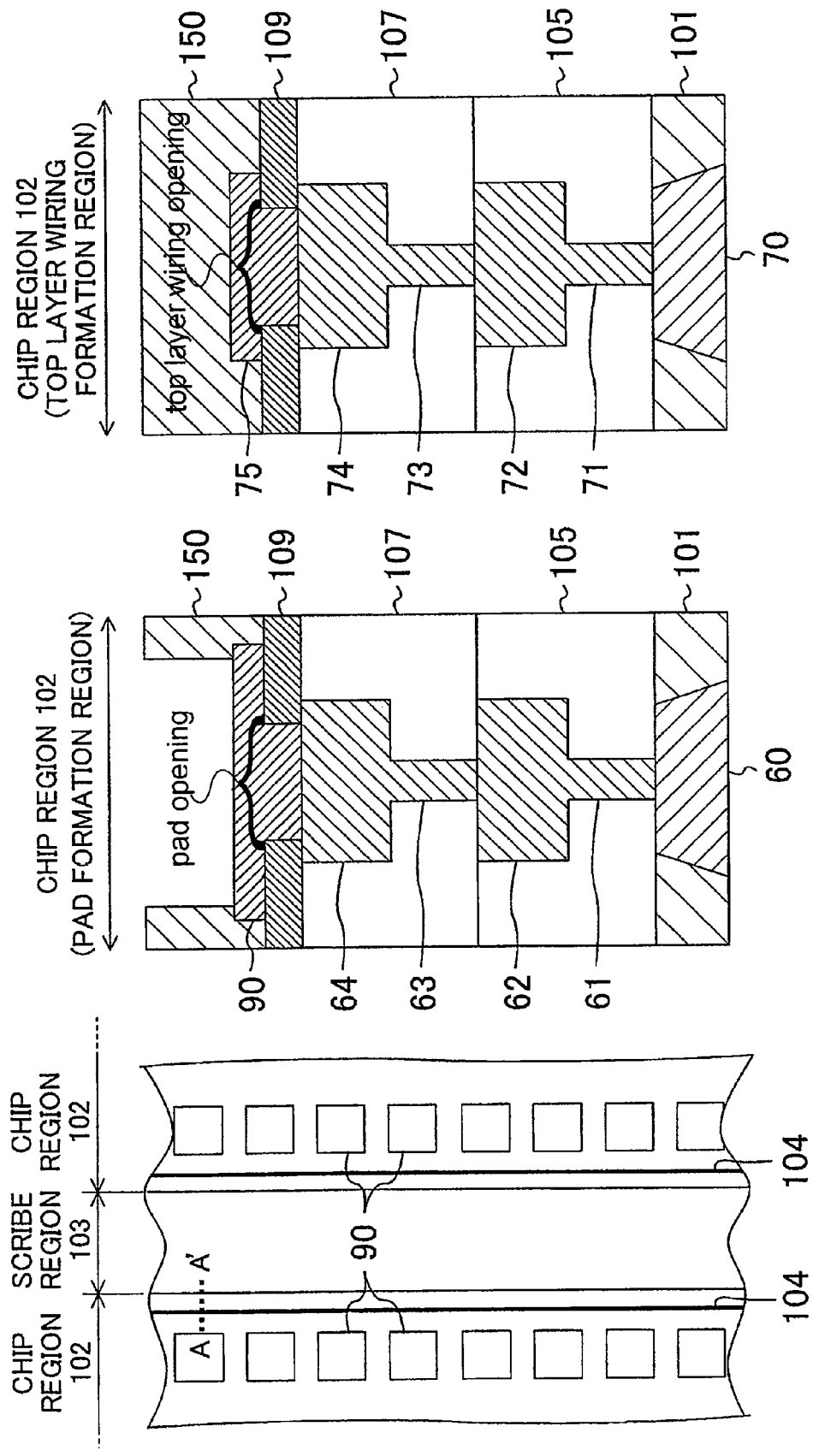
FIG. 2A is an enlarged plan view of a region R1 of FIG. 1 (a region surrounded by a dotted line in FIG. 1)
FIG. 2B is a cross-sectional view of a pad formation region located in a chip region of a semiconductor device according to the first, second, and third embodiments (including their modifications) of the invention.
FIG. 2C is a cross-sectional view of a top layer wiring formation region located in the chip region of the semiconductor device according to the first, second, and third embodiments (including their modifications) of the invention.

FIG. 1 is a plan view of a part of a wafer having a semiconductor device according to each embodiment of the invention that will be described in detail below (for example, a semiconductor device having a seal ring singly surrounding a chip region). FIG. 2A is an enlarged plan view of a region R1 of FIG. 1 (a region surrounded by a dotted line in FIG. 1). FIG. 2B is a cross-sectional view of a pad formation region located in a chip region (a cross-sectional view of a region near a pad 90 shown in FIGS. 1 and 2A). FIG. 2C is a cross-sectional view of a top layer wiring formation region located in the chip region (a top layer wiring is not shown in FIGS. 1 and 2A).

As shown in FIGS. 1 and 2A, a wafer 201 has a plurality of chip regions 102. The wafer 201 will become a semiconductor substrate such as a silicon substrate, and each chip region 102 will become a semiconductor device. An IC (integrated circuit) formed by a plurality of elements and having a prescribed function is provided in each chip region 102. The plurality of chip regions 102 are separated from each other by a grid-like scribe region 103. Before a dicing process, each semiconductor device is formed by the chip region 102 and the scribe region 103. Each semiconductor device (that is, each semiconductor chip) is formed by a chip region 102 in which an IC formed by a plurality of elements and having a prescribed function is provided, and a seal ring 104 formed in the periphery of the chip region 102 so as to surround the chip region 102. In other words, the seal ring 104 is formed in the chip region 102 near the boundary between the chip region 102 and the scribe region 103. A plurality of pads 90 are formed, for example, along the seal ring 104 in the chip region 102.

As shown in FIG. 2B, in a pad formation region of the chip region 102, a first interlayer insulating film 105 and a second interlayer insulating film 107 are sequentially formed on a substrate 101 of the wafer 201. An active layer 60 that forms an element is formed in the substrate 101. A plug (via) 61 connecting to the active layer 60 is formed in the lower portion of the first interlayer insulating film 105 and a wiring 62 connecting to the plug 61 is formed in the upper portion of the first interlayer insulating film 105. A plug (via) 63 connecting to the wiring 62 is formed in the lower portion of the second interlayer insulating film 107 and a wiring 64 connecting to the plug 63 is formed in the upper portion of the second interlayer insulating film 107. The plug 61 and the wiring 62 form a dual damascene wiring and the plug 63 and the wiring 64 form a dual damascene wiring. A first passivation film 109 is formed on the second interlayer insulating film 107. The first passivation film 109 has an opening on the wiring 64, and a pad 90 connecting to the wiring 64 is formed in the opening. A second passivation film 150 is formed on the first passivation film 109. The second passivation film 150 has an opening on the pad 90.

As shown in FIG. 2C, in the top layer wiring formation region of the chip region 102, the first interlayer insulating film 105 and the second interlayer insulating film 107 are sequentially formed on the substrate 101 of the wafer 201. An active layer 70 that forms an element is formed in the substrate 101. A plug (via) 71 connecting to the active layer 70 is formed in the lower portion of the first interlayer insulating film 105 and a wiring 72 connecting to the plug 71 is formed in the upper portion of the first interlayer insulating film 105. A plug (via) 73 connecting to the wiring 72 is formed in the lower portion of the second interlayer insulating film 107 and a wiring 74 connecting to the plug 73 is formed in the upper portion of the second interlayer insulating film 107. The plug 71 and the wiring 72 form a dual damascene wiring and the plug 73 and the wiring 74 form a dual damascene wiring. The first passivation film 109 is formed on the second interlayer insulating film 107. The first passivation film 109 has an opening on the wiring 74 and a top layer wiring 75 connecting to the wiring 74 is formed in the opening. The second passivation film 150 is formed on the first passivation film 109 so as to cover the top layer wiring 75.

The first passivation film 109 is made of a material that is harder and more brittle than a material of the second interlayer insulating film 107, such as a silicon nitride (SiN) film.

As has been described above, after each chip is completed, the wafer 201 having a plurality of semiconductor devices formed thereon is diced along the scribe region 103 so that the semiconductor devices are separated from each other. Each of the semiconductor devices thus separated by the dicing process includes a chip region 102 and a dicing residue of the scribe region 103 in the wafer state (that is, a portion adjacent to the chip region 102). When an individual semiconductor device resulting from the dicing process is described herein, a dicing residue of the scribe region 103 will be simply referred to as the "scribe region 103."

(First Embodiment)

Hereinafter, a semiconductor device and a manufacturing method thereof according to a first embodiment of the invention will be described with reference to the figures.

Figure 3:
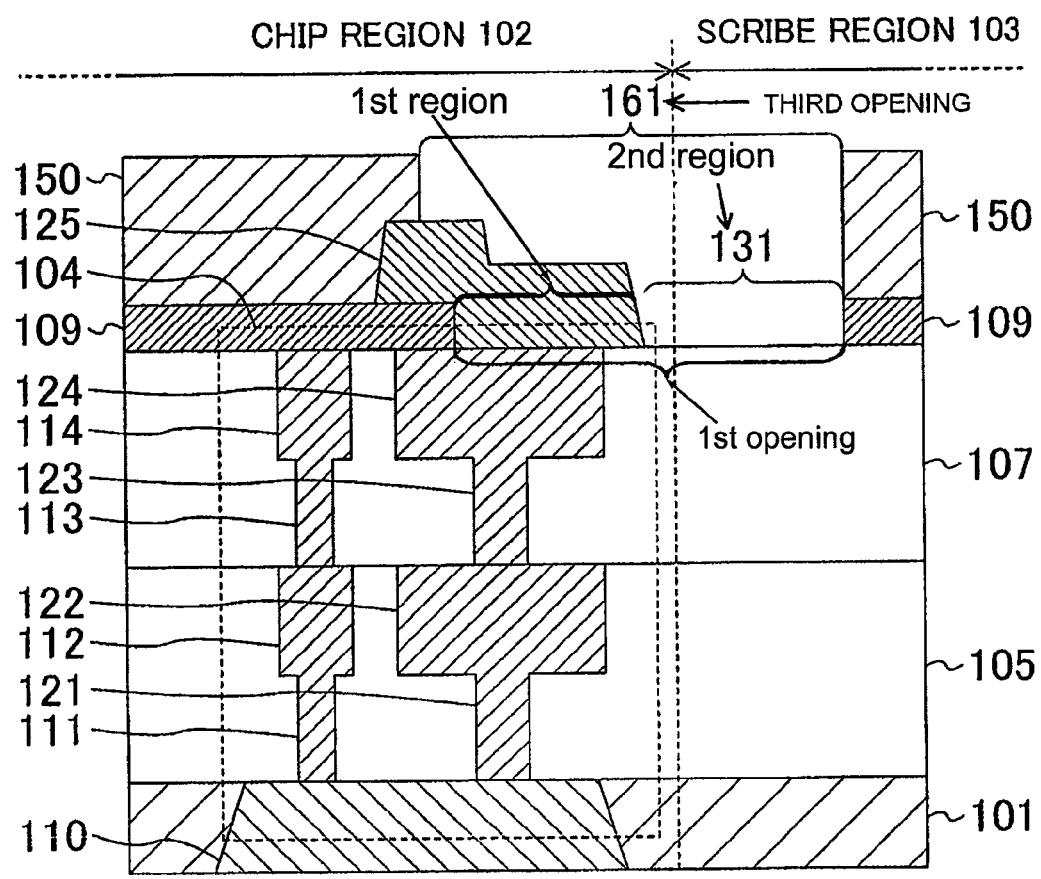
FIG. 3 shows a cross-sectional structure of an end portion of a semiconductor device according to the first embodiment of the invention.

FIG. 3 shows a cross-sectional structure of an end portion of a semiconductor device (more specifically, a diced chip) according to the first embodiment. More specifically, FIG. 3 shows a cross-sectional structure of an end portion of a semiconductor device including a seal ring 104 formed in the periphery of the chip region 102. FIG. 3 is a cross-sectional view taken along line A-A' in FIG. 2A.

As shown in FIG. 3, a chip region 102 is formed adjacent to a scribe region 103 on a substrate 101. A first interlayer insulating film 105 and a second interlayer insulating film 107 are sequentially formed on the substrate 101. A seal ring 104 is formed in the layered structure of the interlayer insulating films 105 and 107. The seal ring 104 extends through this layered structure and continuously surrounds the chip region 102. The seal ring 104 is formed by an active layer (or an electrically conductive layer) 110, first seal vias 111 and 121, first seal wirings 112 and 122, second seal vias 113 and 123, and second seal wirings 114 and 124. The active layer 110 is formed in the substrate 101. The first seal vias 111 and 121 are formed in the lower portion of the first interlayer insulating film 105 and connect to the active layer (or the electrically conductive layer) 110. The first seal wirings 112 and 122 are formed in the upper portion of the first interlayer insulating film 105 and respectively connect to the first seal vias 111 and 121. The second seal vias 113 and 123 are formed in the lower portion of the second interlayer insulating film 107 and respectively connect to the first seal wirings 112 and 122. The second seal wirings 114 and 124 are formed in the upper portion of the second interlayer insulating film 107 and respectively connect to the second seal vias 113 and 123.

This embodiment is characterized in that the first passivation film 109 formed on the second interlayer insulating film 107 has an opening 131 located outside the seal ring 104 when viewed from the chip region 102. In other words, the first passivation film 109 is divided into two portions by the opening 131: a portion located in chip region 102 and a portion located in the scribe portion 103. Note that the opening 131 extends to a position on the seal ring 104, and a cap layer 125 connecting to the seal ring 104 is formed in a part of the opening 131 located on the seal ring 104. The cap layer 125 covers an end portion of the first passivation film 109 in the chip region 102. The surface of the second interlayer insulating film 107 is exposed in a part of the opening 131 where the cap layer 125 is not formed. A second passivation film 150 is formed on the first passivation film 109. The second passivation film 150 has an opening 161 above the opening 131.

Hereinafter, a method for manufacturing a semiconductor device having the structure of FIG. 3 according to this embodiment will be described with reference to FIGS. 4A through 4C, FIGS. 5A and 5B, and FIGS. 6A and 6B. Note that the steps described below are basically performed on a wafer before dicing.

Figure 4A:
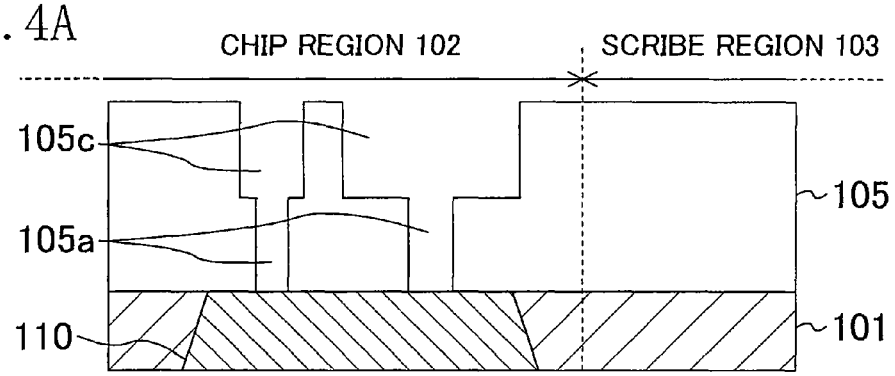
FIGS. 4A, 4B, and 4C are cross-sectional views illustrating the steps of a manufacturing method of a semiconductor device according to the first embodiment of the invention.

As shown in FIG. 4A, in a chip region 102, an active layer (or an electrically conductive layer) 110 is formed in a substrate 101 of a wafer (e.g., the wafer 201 in FIG. 1). The active layer (the electrically conductive layer) 110 may form an element such as a transistor. In a pad formation region of the chip region 102, an active layer 60 that forms an element may be formed in the substrate 101 as shown in FIG. 2B. In a top layer wiring formation region of the chip region 102, an active layer 70 that forms an element may be formed in the substrate 101 as shown in FIG. 2C.

As shown in FIG. 4A, a first interlayer insulating film 105 is then deposited on the substrate 101. By a lithography method and a dry etching method, two groove-like recesses 105a for forming first seal vias 111 and 121 (see FIG. 4B) are formed in the first interlayer insulating film 105 in a seal-ring formation region of the chip region 102 so as to reach the active layer (or the electrically conductive layer) 110. It should be noted that a seal via is a part of the seal ring and is formed by filling a groove-like recess with an electrically conductive material. A seal via therefore has a line-shaped structure having about the same width as that of a via that is formed in the chip region for connecting upper and lower wirings to each other.

In this embodiment, the aspect ratio of a seal via (the ratio of a depth to a width of a groove-like recess with a seal via formed therein) is preferably 1 or more.

As shown in FIG. 4A, a resist pattern (not shown) for forming wiring grooves for first seal wirings 112 and 122 (see FIG. 4B) is formed on the first interlayer insulating film 105 by a lithography method. By using the resist pattern as a mask, two wiring grooves 105c respectively connecting to the two groove-like recesses 105a are formed in the upper portion of the first interlayer insulating film 105 in the seal-ring formation region of the chip region 102. The remaining resist pattern is then removed by an ashing method.

It should be noted that the groove-like recesses 105a and the wiring grooves 105c are formed so as to continuously surround the chip region 102.

Figure 4B:
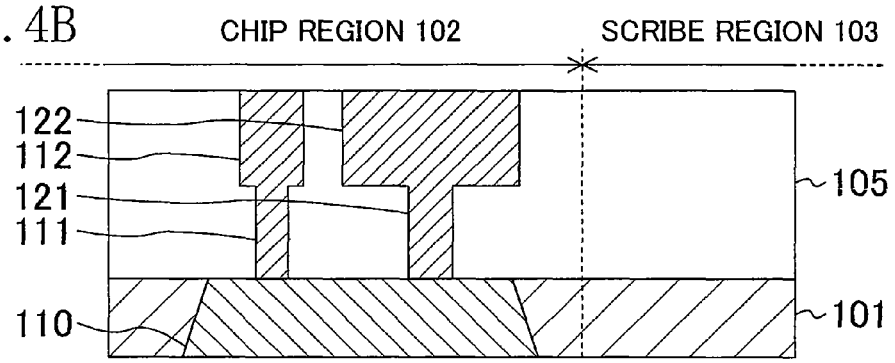

As shown in FIG. 4B, an electrically conductive film such as tungsten (W) is formed in the groove-like recesses 105a and the wiring grooves 105c in the first interlayer insulating film 105 by, for example, a CVD (chemical vapor deposition) method, and an excessive electrically conductive film outside the wiring grooves 105c is removed by, for example, a CMP (chemical mechanical polishing) method. First seal vias 111 and 121 connecting to the active layer (or the electrically conductive layer) 110 and first seal wirings 112 and 122 respectively connecting to the first seal vias 111 and 121 are thus formed. The seal via 111 and the seal wiring 112 form a dual damascene wiring and the seal via 121 and the seal wiring 122 form a dual damascene wiring. At this time, as shown in FIG. 2B, a plug (via) 61 connecting to the active layer 60 and a wiring 62 connecting to the plug 61 are formed in the first interlayer insulating film 105 in the pad formation region of the chip region 102. As shown in FIG. 2C, a plug (via) 71 connecting to the active layer 70 and a wiring 72 connecting to the plug 71 are also formed in the first interlayer insulating film 105 in the top layer wiring formation region of the chip region 102.

Figure 4C:
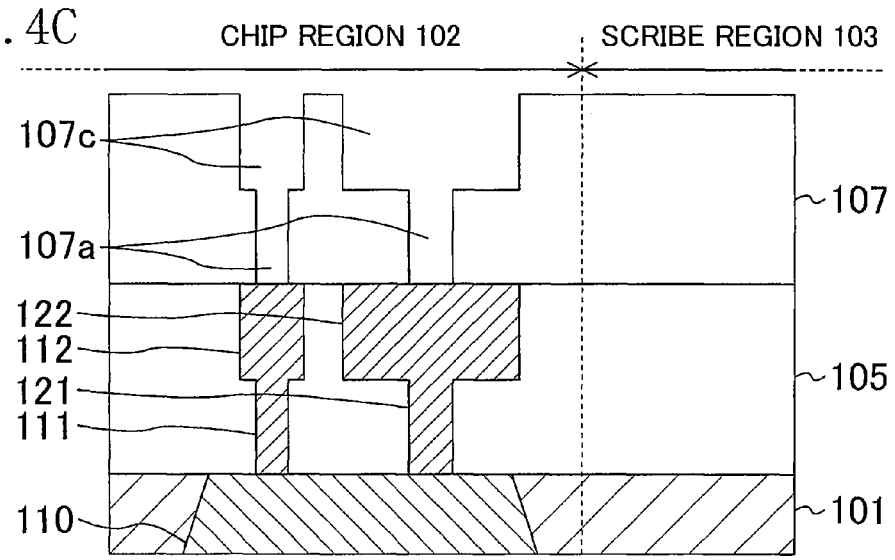

As shown in FIG. 4C, a second interlayer insulating film 107 is then deposited on the first interlayer insulating film 105, and by a lithography method and a dry etching method, two groove-like recesses 107a for forming second seal vias 113 and 123 (see FIG. 5A) are formed in the second interlayer insulating film 107 in the chip region 102 so as to reach the first seal wirings 112 and 122, respectively.

As shown in FIG. 4C, a resist pattern (not shown) for forming wiring grooves for second seal wirings 114 and 124 (see FIG. 5A) is then formed on the second interlayer insulating film 107 by a lithography method. By using the resist pattern as a mask, two wiring grooves 107c respectively connecting to the two groove-like recesses 107a are formed in the upper portion of the second interlayer insulating film 107 in the chip region 102 by a dry etching method. The remaining resist pattern is then removed by an ashing method.

It should be noted that the groove-like recesses 107a and the wiring grooves 107c are formed so as to continuously surround the chip region 102.

Figure 5A:
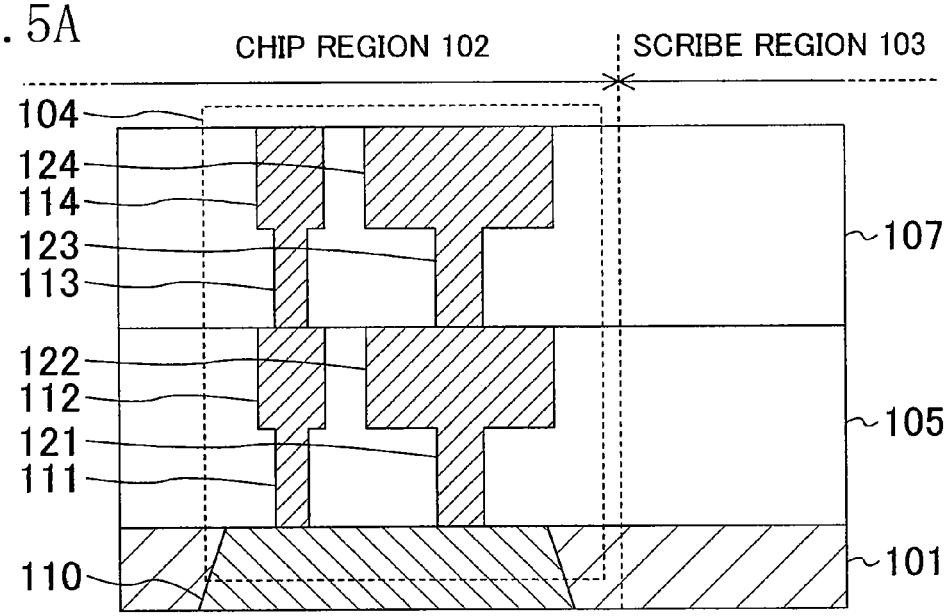
FIGS. 5A and 5B are cross-sectional views illustrating the steps of the manufacturing method of a semiconductor device according to the first embodiment of the invention.

As shown in FIG. 5A, an electrically conductive film such as copper (Cu) is formed in the groove-like recesses 107a and the wiring grooves 107c in the second interlayer insulating film 107. An excessive electrically conductive film outside the wiring grooves 107c (that is, the electrically conductive film that is present above the second interlayer insulating film 107) is removed by, for example, a CMP method. Second seal vias 113 and 123 respectively connecting to the first seal wirings 112 and 122 and second seal wirings 114 and 124 respectively connecting to the second seal vias 113 and 123 are thus formed in the second interlayer insulating film 107 in the chip region 102. The seal via 113 and the seal wiring 114 form a dual damascene wiring and the seal via 123 and the seal wiring 124 form a dual damascene wiring. At this time, as shown in FIG. 2B, a plug (via) 63 connecting to the wiring 62 and a wiring 64 connecting to the plug 63 are formed in the second interlayer insulating film 107 in the pad formation region of the chip region 102. As shown in FIG. 2C, a plug (via) 73 connecting to the wiring 72 and a wiring 74 connecting to the plug 73 are also formed in the second interlayer insulating film 107 in the top layer wiring formation region of the chip region 102.

A method for simultaneously forming a via and a wiring by forming an electrically conductive film in a recess as described above is generally referred to as a dual damascene method.

A seal ring 104 is formed by the active layer (or the electrically conductive layer) 110, the first seal vias 111 and 121, the first seal wirings 112 and 122, the second seal vias 113 and 123, and the second seal wirings 114 and 124 which are formed as described above.

Figure 5B:
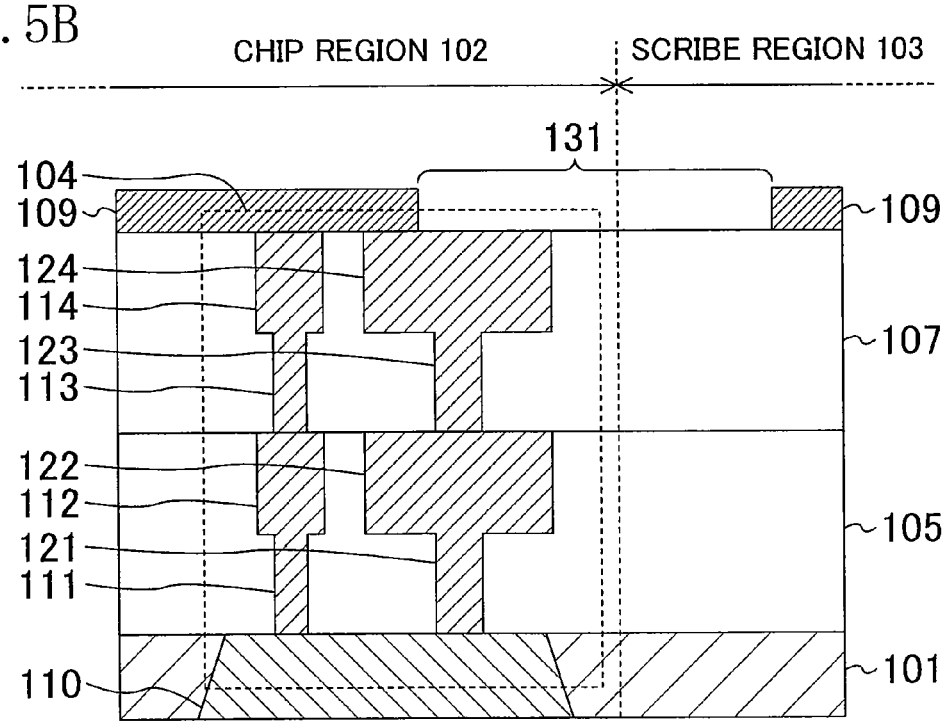

As shown in FIG. 5B, a first passivation film 109 is then deposited on the second interlayer insulating film 107 that is an interlayer insulating film of an uppermost layer, as a protective film for the seal wirings 114 and 124 and the wirings 64 and 74 (see FIGS. 2B and 2C). For example, a single layer structure of a SiN (silicon nitride) film or a layered structure of a TEOS film (a lower layer) and a SiN film (an upper layer) is used as the first passivation film 109. An opening 131 is then formed in the first passivation film 109 by a lithography method and a dry etching method so as to extend from a position outside the seal ring 104 when viewed from the chip region 102 to a position on the seal ring 104 (more specifically, on the seal wiring 124). Note that the opening 131 has a groove shape continuously surrounding the chip region 102. At this time, a groove may be formed in the second interlayer insulating film 107 under the opening 131 located outside the seal ring 104 when viewed from the chip region 102. In other words, by using the seal wiring 124 as a stopper in the step of etching the first passivation film 109, a groove may be formed only in the second interlayer insulating film 107 by etching the upper portion of the second interlayer insulating film 107 located outside the seal ring 104 when viewed from the chip region 102.

Thereafter, an Al (aluminum) film, for example, is deposited on the whole surface of the first passivation film 109 including the opening 131 by, for example, a sputtering method. The Al film is then patterned into a prescribed shape by a lithography method and a dry etching method. More specifically, an unnecessary Al film is removed from the region other than a part of the opening 131 located on the seal wiring 124 and a portion around this part of the opening 131. As shown in FIG. 6A, a cap layer 125 connecting to the seal wiring 124 is thus formed in the part of the opening 131 located on the seal wiring 124. In other words, in the seal ring formation region, that is, in the periphery of the chip region 102, the second seal wiring 114 located on the inner side of the chip region 102 in the top portion of the seal ring 104 is covered by the first passivation film 109, and the second seal wiring 124 located on the side of the scribe region 103 in the top portion of the seal ring 104 is covered by the first passivation film 109 and the cap layer 125. The cap layer 125 covers an end portion of the first passivation film 109 in the chip region 102. The cap layer 125 is also located adjacent to the exposed portion of the second interlayer insulating film 107 in the opening 131 located outside the seal wiring 124 when viewed from the chip region 102. In other words, the end portion of the first passivation film 109 in the scribe region 103 is not covered by the cap layer 125 and is separated from the cap layer 125. At this time, in the pad formation region of the chip region 102, a pad 90 connecting to the wiring 64 is formed in the opening in the first passivation film 109 as shown in FIG. 2B. In the top layer wiring formation region of the chip region 102, a top layer wiring 75 connecting to the wiring 74 is formed in the opening in the first passivation film 109 as shown in FIG. 2C. In other words, in this embodiment, the cap layer 125 connecting to the second seal wiring 124 in the top portion of the seal ring 104 is simultaneously formed in the wiring/pad formation step in the chip region 102. Therefore, the cap layer 125 connecting to the second seal wiring 124 in the top portion of the seal ring 104 can be formed without performing an additional cap layer formation step.

As shown in FIG. 6B, a second passivation film 150 is then deposited over the whole surface of the substrate 101. More specifically, a second passivation film 150 is deposited on the first passivation film 109 including the opening 131 and on the cap layer 125 as a protective film for the cap layer 125, the pad 90 (see FIG. 2B), and the top layer wiring 75 (see FIG. 2C). For example, a single layer structure of a SiN film is used as the second passivation film 150. An opening 161 is then formed in the second passivation film 150 by a lithography method and a dry etching method so as to extend over the opening 131 in the first passivation film 109 and over the cap layer 125. The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

As has been described above, according to this embodiment, the passivation films 109 and 150 are separated by the openings 131 and 161 in the outside of the seal ring 104 (near the periphery of the chip region 102). Therefore, even when the passivation films 109 and 150 located outside the chip region 102 (that is, in the scribe region 103) peel from the substrate 101 by the impact caused by dicing of the wafer, the passivation films 109 and 150 in the chip region 102 can be prevented from peeling from the substrate 101. In this embodiment, the second interlayer insulating film 107 is exposed in the openings 131 and 161 that separate the passivation films 109 and 150 between the inside and outside of the chip region 102. Therefore, the impact applied to the passivation films 109 and 150 outside the chip region 102 can be more reliably prevented from transmitting through the passivation films 109 and 150 into the chip region 102, as compared to the structure in which a cap layer or the like is formed in the entire openings 131 and 161. Accordingly, chippings, cracks, and the like that are produced by dicing the wafer into individual chips can be prevented from spreading into the chip region 102, and therefore contaminants such as water and mobile ions can be prevented from entering the device through the chip surface. As a result, reliability and moisture resistance of the semiconductor device can be improved.

According to this embodiment, the opening 131 in the first passivation film 109 extends to a position on the seal ring 104 (more specifically, on the seal wiring 124), and the cap layer 125 connecting to the seal wiring 124 is formed in the part of the opening 131 located on the seal wiring 124. Therefore, transmission of impact, stress, and the like from the outside of the chip region 102 (the scribe region 103) toward the inside of the chip region 102 in the dicing process of the wafer can be blocked by the cap layer 125 and the seal ring 104 having toughness and malleability. Therefore, the passivation films 109 and 150 in the chip region 102 can be more reliably prevented from peeling from the substrate 101. As a result, reliability and moisture resistance of the semiconductor device can further be improved.

According to this embodiment, the cap layer 125 covers the end portion of the first passivation film 109 in the chip region 102. Therefore, stress generated by the impact caused by dicing of the wafer can be prevented from being intensively applied to the side surface of the first passivation film 109 in the chip region 102 (the side surface facing the opening 131). Accordingly, the first passivation film 109 in the chip region 102 can be more reliably prevented from peeling from the substrate 101.

In this embodiment, the opening 131 formed in the first passivation film 109 may extend not only on the end portion of the chip region 102 located outside the seal ring 104 but also on the dicing residue of the scribe region 103. The opening 131 may alternatively be formed by not forming the passivation film 109 in the scribe region 103 in the wafer state.

In this embodiment, the seal ring 104 (more specifically, the seal wirings 114 and 124) is covered by the passivation film 109 and the cap layer 125. Therefore, the seal ring 104 will not be corroded.

In this embodiment, a wiring structure may be formed in the interlayer insulating films 105 and 107 in the scribe region 103.

In this embodiment, a single seal via such as the second seal via 123 is connected to the bottom of a single seal wiring such as the second seal wiring 124. Alternatively, a plurality of seal vias may be connected to the bottom of a single seal wiring.

In this embodiment, in the case where a groove is formed in the exposed portion of the interlayer insulating film 107 in the opening 131, a transmission path of the impact, stress, and the like from the outside of the chip region 102 (the scribe region 103) toward the inside of the chip region 102 in the dicing process of the wafer can be blocked. Therefore, degradation in reliability and moisture resistance of the semiconductor device can be more reliably prevented.

In this embodiment, it is preferable that the first passivation film 109 has a thickness of 150 nm or more in order to reliably protect the seal wirings 114 and 124 and the wirings 64 and 74.

In this embodiment, a material of each seal wiring and each seal via of the seal ring 104 is not limited, but at least one of tungsten (W), aluminum (Al), and copper (Cu) may be used.

In this embodiment, a material of the cap layer 125 connecting to the seal ring 104 is not limited. However, in the case where the cap layer 125 is made of, for example, Al, corrosion of the seal ring 104 (especially the seal ring 104 made of Cu) can be reliably prevented.

(First Modification of the First Embodiment)

Hereinafter, a semiconductor device and a manufacturing method thereof according to a first modification of the first embodiment of the invention will be described with reference to the figures.

Figure 7:
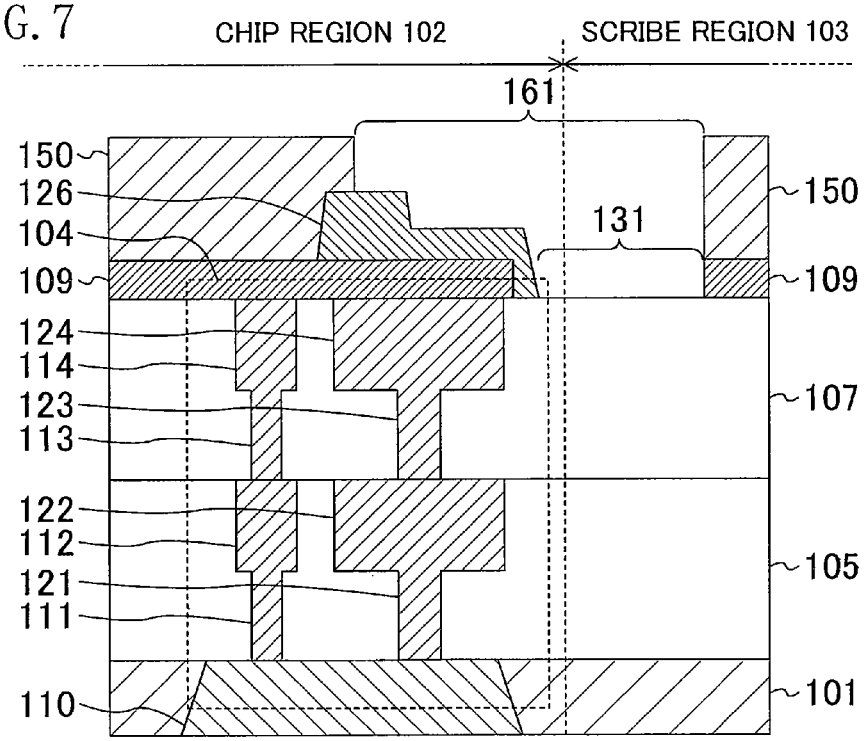
FIG. 7 shows a cross-sectional structure of an end portion of a semiconductor device according to a first modification of the first embodiment of the invention.

FIG. 7 shows a cross-sectional structure of an end portion of a semiconductor device (more specifically, a diced chip) according to this modification. More specifically, FIG. 7 shows a cross-sectional structure of an end portion of a semiconductor device including a seal ring 104 formed in the periphery of the chip region 102 as shown in FIG. 1. Note that FIG. 7 is a cross-sectional view taken along line A-A' of FIG. 2A. In FIG. 7, the same elements as those of the semiconductor device of the first embodiment shown in FIG. 3 are denoted with the same reference numerals and description thereof will be omitted as appropriate.

This modification is different from the first embodiment in the following points: in the first embodiment, as shown in FIG. 3, the opening 131 that separates the first passivation film 109 into a portion in the chip region 102 and a portion in the scribe region 103 extends from the outside of the seal ring 104 when viewed from the chip region 102 to a position on the seal ring 104. In this modification, on the other hand, as shown in FIG. 7, the opening 131 does not extend on the seal ring 104. More specifically, the opening 131 extends only on the outside of the seal ring 104 when viewed from the chip region 102. In the first embodiment, as shown in FIG. 3, the cap layer 125 connecting to the second seal wiring 124 of the seal ring 104 is formed in the part of the opening 131 located on the second seal wiring 124 of the seal ring 104. In this modification, however, as shown in FIG. 7, a cap layer 126 covers an end portion of the first passivation film 109 in the chip region 102. The cap layer 126 does not connect to the seal ring 104 and partially contacts the second interlayer insulating film 107 that is exposed by the opening 131. In other words, in this modification, as shown in FIG. 7, the seal ring 104 (more specifically, the seal wirings 114 and 124) are covered only by the first passivation film 109.

In this modification, as in the first embodiment, the surface of the second interlayer insulating film 107 is exposed in the opening 131 and a second passivation film 150 having an opening 161 above the opening 131 and the cap layer 126 is formed on the first passivation film 109, as shown in FIG. 7.

Hereinafter, a method for manufacturing a semiconductor device having the structure of FIG. 7 according to this modification will be described. Note that the steps described below are basically performed on a wafer before dicing.

First, the steps of the first embodiment shown in FIGS. 4A, 4B, 4C, and 5A are conducted. As shown in FIG. 7, a first passivation film 109 is then deposited on the second interlayer insulating film 107 that is an interlayer insulating film of an uppermost layer, as a protective film for the seal wirings 114 and 124 and the wirings 64 and 74 (see FIGS. 2B and 2C). For example, a single layer structure of a SiN film or a layered structure of a TEOS film (a lower layer) and a SiN film (an upper layer) is used as the first passivation film 109. By a lithography method and a dry etching method, an opening 131 is then formed in the first passivation film 109 at a position outside the seal ring 104 when viewed from the chip region 102. Note that the opening 131 has a groove shape continuously surrounding the chip region 102, but does not extend on the seal ring 104 (more specifically, on the seal wiring 124). A groove may be formed in the second interlayer insulating film 107 under the opening 131.

Thereafter, an Al (aluminum) film, for example, is deposited on the whole surface of the first passivation film 109 including the opening 131 by, for example, a sputtering method. The Al film is then patterned into a prescribed shape by a lithography method and a dry etching method. More specifically, an unnecessary Al film is removed from the region other than an end portion of the first passivation film 109 in the chip region 102 and a portion around the end portion of the first passivation film 109. As shown in FIG. 7, a cap layer 126 thus formed covers the end portion of the first passivation film 109 in the chip region 102 (but does not contact the seal ring 104). In other words, in the seal ring formation region, that is, in the periphery of the chip region 102, the second seal wiring 124 in the top portion of the seal ring 104 is covered by the cap layer 126 with the first passivation film 109 interposed therebetween. At this time, in the pad formation region of the chip region 102, a pad 90 connecting to the wiring 64 is formed in the opening in the first passivation film 109 as shown in FIG. 2B. In the top layer wiring formation region of the chip region 102, a top layer wiring 75 connecting to the wiring 74 is formed in the opening in the first passivation film 109 as shown in FIG. 2C. In other words, in this modification, the cap layer 126 that does not connect to the seal ring 104 is simultaneously formed in the wiring/pad formation step in the chip region 102. Therefore, the cap layer 126 can be formed over the seal ring 104 without performing an additional cap layer formation step.

As shown in FIG. 7, a second passivation film 150 is then deposited over the whole surface of the substrate 101. More specifically, a second passivation film 150 is deposited on the first passivation film 109 including the opening 131 and on the cap layer 126 as a protective film for the cap layer 126, the pad 90 (see FIG. 2B), and the top layer wiring 75 (see FIG. 2C). For example, a single layer structure of a SiN film is used as the second passivation film 150. An opening 161 is then formed in the second passivation film 150 by a lithography method and a dry etching method so as to extend over the opening 131 in the first passivation film 109 and over the cap layer 126. The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

As has been described above, according to this modification, the passivation films 109 and 150 are separated by the openings 131 and 161 in the outside of the seal ring 104 (near the periphery of the chip region 102). Therefore, even when the passivation films 109 and 150 located outside the chip region 102 peel from the substrate 101 by the impact caused by dicing of the wafer, the passivation films 109 and 150 in the chip region 102 can be prevented from peeling from the substrate 101. In this modification, the second interlayer insulating film 107 is exposed in the openings 131 and 161 that separate the passivation films 109 and 150 between the inside and outside of the chip region 102. Therefore, the impact applied to the passivation films 109 and 150 outside the chip region 102 can be more reliably prevented from transmitting through the passivation films 109 and 150 into the chip region 102, as compared to the structure in which a cap layer or the like is formed in the entire openings 131 and 161. Accordingly, chippings, cracks, and the like that are produced by dicing the wafer into individual chips can be prevented from spreading into the chip region 102, and therefore contaminants such as water and mobile ions can be prevented from entering the device through the chip surface. As a result, reliability and moisture resistance of the semiconductor device can be improved.

According to this modification, the cap layer 126 covers the end portion of the first passivation film 109 in the chip region 102. Therefore, stress generated by the impact caused by dicing of the wafer can be prevented from being intensively applied to the side surface of the first passivation film 109 in the chip region 102 (the side surface facing the opening 131). Accordingly, the first passivation film 109 in the chip region 102 can be more reliably prevented from peeling from the substrate 101. In this modification, the seal ring 104 is covered by the first passivation film 109. Therefore, the cap layer 126 may peel from the substrate 101 by the impact, stress, and the like caused by dicing of the wafer.

In this modification, the seal ring 104 (more specifically, the seal wirings 114 and 124) is covered by the passivation film 109. Therefore, the seal ring 104 will not be corroded.

In this modification, in the case where a groove is formed in the exposed portion of the interlayer insulating film 107 in the opening 131, a transmission path of the impact, stress, and the like from the outside of the chip region 102 toward the inside of the chip region 102 in the dicing process of the wafer can be blocked. Therefore, degradation in reliability and moisture resistance of the semiconductor device can be more reliably prevented.

(Second Modification of the First Embodiment)

Hereinafter, a semiconductor device and a manufacturing method thereof according to a second modification of the first embodiment of the invention will be described with referenced to the figures.

Figure 8:
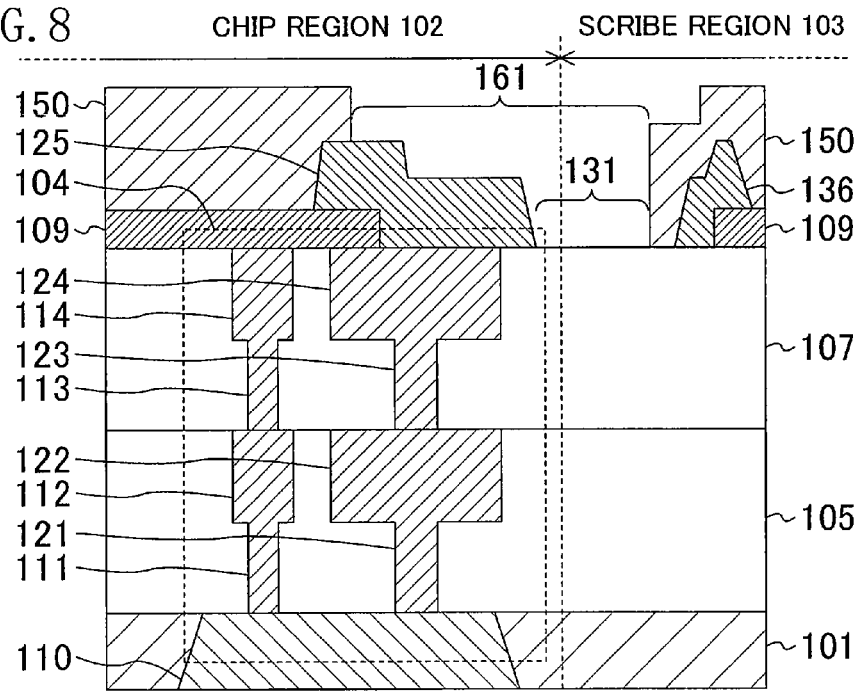
FIG. 8 shows a cross-sectional structure of an end portion of a semiconductor device according to a second modification of the first embodiment of the invention.

FIG. 8 shows a cross-sectional structure of an end portion of a semiconductor device (more specifically, a diced chip) according to this modification. More specifically, FIG. 8 shows a cross-sectional structure of an end portion of a semiconductor device including a seal ring 104 formed in the periphery of the chip region 102 as shown in FIG. 1. Note that FIG. 8 is a cross-sectional view taken along line A-A' of FIG. 2A. In FIG. 8, the same elements as those of the semiconductor device of the first embodiment shown in FIG. 3 are denoted with the same reference numerals and description thereof will be omitted as appropriate.

This modification is different from the first embodiment in the following points: as shown in FIG. 8, in addition to the cap layer 125 connecting to the seal ring 104, a cap layer 136 is formed so as to cover an end portion of the first passivation film 109 located on the opposite side to the chip region 102 when viewed from the opening 131. In other words, the cap layer 136 is formed so as to cover an end portion of the first passivation film 109 in the scribe region 103. In this modification, as shown in FIG. 8, the first passivation film 109 located on the opposite side to the chip region 102 when viewed from the opening 131 (i.e., the first passivation film 109 in the scribe region 103) is covered by the cap region 136 and the second passivation film 150 located on the same side (i.e., the second passivation film 150 in the scribe region 103).

In this modification, as in the first embodiment, the surface of the second interlayer insulating film 107 is exposed in the opening 131 and the second passivation film 150 having an opening 161 above the opening 131 and the cap layer 125 is formed on the first passivation film 109, as shown in FIG. 8.

Hereinafter, a method for manufacturing a semiconductor device having the structure of FIG. 8 according to this modification will be described. Note that the steps described below are basically performed on a wafer before dicing.

First, the steps of the first embodiment shown in FIGS. 4A, 4B, 4C, 5A, and 5B are conducted. An Al (aluminum) film, for example, is deposited on the whole surface of the first passivation film 109 including the opening 131 by, for example, a sputtering method. The Al film is then patterned into a prescribed shape by a lithography method and a dry etching method. More specifically, an unnecessary Al film is removed from the region other than a part of the opening 131 located on the seal wiring 124, a portion around the part of the opening 124, an end portion of the first passivation film 109 located on the opposite side to the chip region 102 when viewed from the opening 131 (i.e., an end portion of the first passivation film 109 in the scribe region 103), and a portion around the end portion of the first passivation film 109. A cap layer 125 and a cap layer 136 are thus formed as shown in FIG. 8. More specifically, the cap layer 125 connecting to the seal wiring 124 is formed in the part of the opening 131 located on the seal wiring 124, and the cap layer 136 covers the end portion of the first passivation film 109 located on the opposite side to the chip region 102 when viewed from the opening 131, that is, the end portion of the first passivation film 109 in the scribe region 103. Note that the cap layer 125 covers the top portion of the seal ring 104 and the end portion of the first passivation film 109 in the chip region 102. At this time, in the pad formation region of the chip region 102, a pad 90 connecting to the wiring 64 is formed in the opening in the first passivation film 109 as shown in FIG. 2B. In the top layer wiring formation region of the chip region 102, a top layer wiring 75 connecting to the wiring 74 is formed in the opening in the first passivation film 109 as shown in FIG. 2C. In other words, in this modification, the cap layers 125 and 136 are simultaneously formed in the wiring/pad formation step in the chip region 102. Therefore, the cap layers 125 and 136 can be formed without performing an additional cap layer formation step.

As shown in FIG. 8, a second passivation film 150 is then deposited over the whole surface of the substrate 101. More specifically, a second passivation film 150 is deposited on the first passivation film 109 including the opening 131 and on the cap layers 125 and 136 as a protective film for the cap layers 125 and 136, the pad 90 (see FIG. 2B), and the top layer wiring 75 (see FIG. 2C). For example, a single layer structure of a SiN film is used as the second passivation film 150. An opening 161 is then formed in the second passivation film 150 by a lithography method and a dry etching method so as to extend over the opening 131 in the first passivation film 109 and over the cap layer 125. In this modification, the opening 161 is formed so that the first passivation film 109 located on the opposite side to the chip region 102 when viewed from the opening 131 (that is, the first passivation film 109 in the scribe region 103) and the cap layer 136 are covered by the second passivation film 150 located on the same side (that is, the second passivation film 150 in the scribe region 103). The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

This modification has the following effects in addition to the effects of the first embodiment: the end portion of the first passivation film 109 located on the opposite side to the chip region 102 when viewed from the opening 131 is not aligned with the end portion of the second passivation film 150 located on the opposite side to the chip region 102 when viewed from the opening 161. In other words, the end portion of the first passivation film 109 in the scribe region 103 is not aligned with the end portion of the second passivation film 150 in the scribe region 103. Therefore, etching of the second passivation film 150 that is formed with a uniform thickness and a smooth surface in order to cover the top layer wiring 75 (see FIG. 2C) and the like can be easily conducted.

In this modification, in the case where a groove is formed in the exposed portion of the interlayer insulating film 107 in the opening 131, a transmission path of the impact, stress, and the like from the outside of the chip region 102 toward the inside of the chip region 102 in the dicing process of the wafer can be blocked. Therefore, degradation in reliability and moisture resistance of the semiconductor device can be more reliably prevented.

In this modification, the second passivation film 150 located on the opposite side to the chip region 102 when viewed from the opening 161 covers the first passivation film 109 located on the same side and the cap layer 136. In other words, the second passivation film 150 in the scribe region 103 covers the first passivation film 109 in the scribe region 103 and the cap layer 136. Alternatively, an end portion of the second passivation film 150 located on the opposite side to the chip region 102 when viewed from the opening 161 (an end portion of the second passivation film 150 in the scribe region 103) may be located on the cap layer 136 or on the passivation film 109 located on the same side (that is, on the passivation film 109 in the scribe region 103).

(Third Modification of the First Embodiment)

Hereinafter, a semiconductor device and a manufacturing method thereof according to a third modification of the first embodiment of the invention will be described with reference to the figures.

Figure 9:
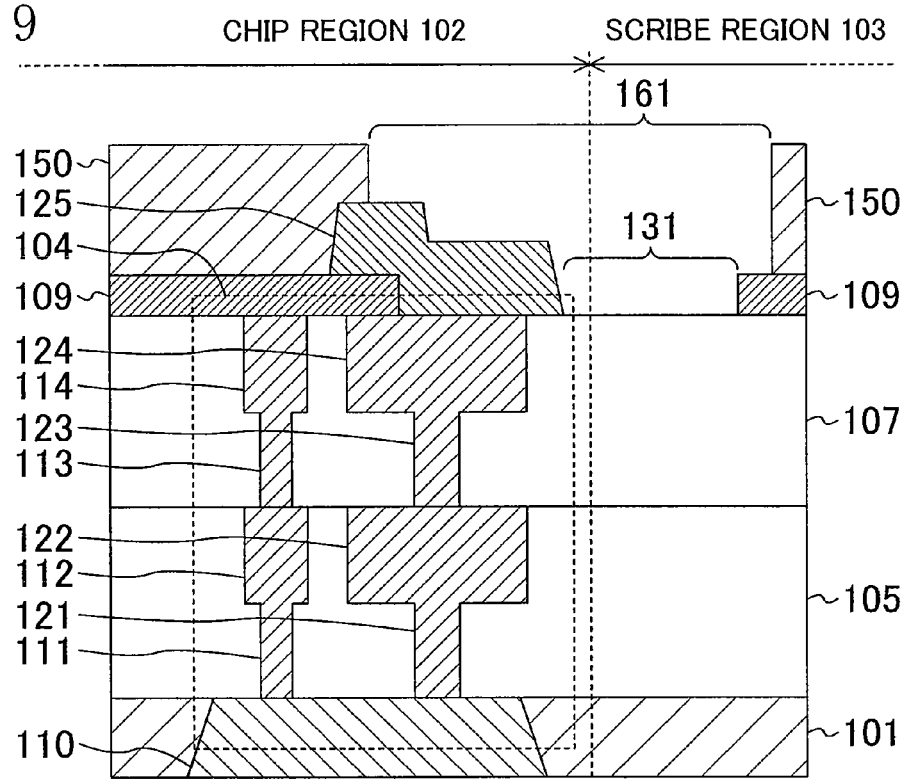
FIG. 9 shows a cross-sectional structure of an end portion of a semiconductor device according to a third modification of the first embodiment of the invention.

FIG. 9 shows a cross-sectional structure of an end portion of a semiconductor device (more specifically, a diced chip) according to this modification. More specifically, FIG. 9 shows a cross-sectional structure of an end portion of a semiconductor device including a seal ring 104 formed in the periphery of the chip region 102 as shown in FIG. 1. Note that FIG. 9 is a cross-sectional view taken along line A-A' of FIG. 2A. In FIG. 9, the same elements as those of the semiconductor device of the first embodiment shown in FIG. 3 are denoted with the same reference numerals and description thereof will be omitted as appropriate.

This modification is different from the first embodiment in the following points: as shown in FIG. 9, an end portion of the first passivation film 109 located on the opposite side to the chip region 102 when viewed from the opening 131 is not aligned with an end portion of the second passivation film 150 located on the opposite side to the chip region 102 when viewed from the opening 161. In other words, the end portion of the first passivation film 109 in the scribe region 103 is not aligned with the end portion of the second passivation film 150 in the scribe region 103. As shown in FIG. 9, the end portion of the second passivation film 150 in the scribe region 103 is located on the first passivation film 109 in the scribe region 103.

In this modification, as in the first embodiment, the surface of the second interlayer insulating film 107 is exposed in the opening 131 and the second passivation film 150 having the opening 161 above the opening 131 is formed on the first passivation film 109, as shown in FIG. 9.

Hereinafter, a method for manufacturing a semiconductor device having the structure of FIG. 9 according to this modification will be described. Note that the steps described below are basically performed on a wafer before dicing.

First, the steps of the first embodiment shown in FIGS. 4A, 4B, 4C, 5A, 5B, and 6A are conducted. As shown in FIG. 9, a second passivation film 150 is then deposited over the whole surface of the substrate 101. More specifically, a second passivation film 150 is deposited on the first passivation film 109 including the opening 131 and on the cap layer 125 as a protective film for the cap layer 125, the pad 90 (see FIG. 2B), and the top layer wiring 75 (see FIG. 2C). For example, a single layer structure of a SiN film is used as the second passivation film 150. An opening 161 is then formed in the second passivation film 150 by a lithography method and a dry etching method so as to extend over the opening 131 in the first passivation film 109 and over the cap layer 125. In this modification, the opening 161 is formed so that the end portion of the second passivation film 150 located on the opposite side to the chip region 102 when viewed from the opening 161 is located on the first passivation film 109 located on the same side. In other words, the opening 161 is formed so that the end portion of the second passivation film 150 in the scribe region 103 is located on the first passivation film 109 in the scribe region 103. The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

This modification has the following effects in addition to the effects of the first embodiment: the end portion of the first passivation film 109 located on the opposite side to the chip region 102 when viewed from the opening 131 is not aligned with the end portion of the second passivation film 150 located on the opposite side to the chip region 102 when viewed from the opening 161. In other words, the end portion of the first passivation film 109 in the scribe region 103 is not aligned with the end portion of the second passivation film 150 in the scribe region 103. Therefore, etching of the second passivation film 150 that is formed with a uniform thickness and a smooth surface in order to cover the top layer wiring 75 (see FIG. 2C) and the like can be easily conducted.

In this modification, in the case where a groove is formed in the exposed portion of the interlayer insulating film 107 in the opening 131, a transmission path of the impact, stress, and the like from the outside of the chip region 102 toward the inside of the chip region 102 in the dicing process of the wafer can be blocked. Therefore, degradation in reliability and moisture resistance of the semiconductor device can be more reliably prevented.

(Fourth Modification of the First Embodiment)

Hereinafter, a semiconductor device and a manufacturing method thereof according to a fourth modification of the first embodiment of the invention will be described with reference to the figures.

Figure 10:
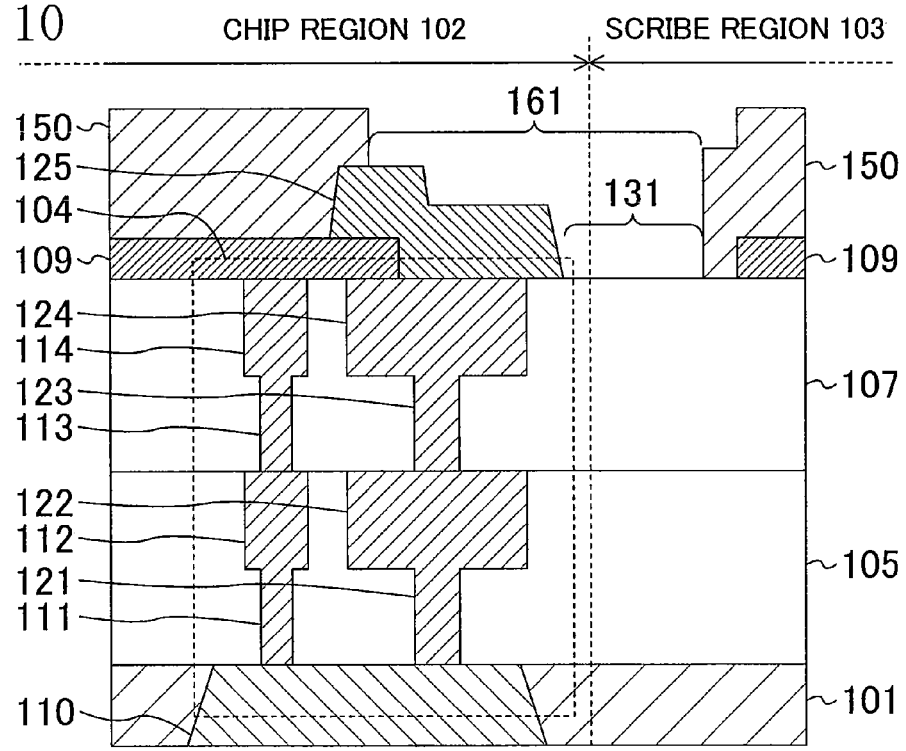
FIG. 10 shows a cross-sectional structure of an end portion of a semiconductor device according to a fourth modification of the first embodiment of the invention.

FIG. 10 shows a cross-sectional structure of an end portion of a semiconductor device (more specifically, a diced chip) according to this modification. More specifically, FIG. 10 shows a cross-sectional structure of an end portion of a semiconductor device including a seal ring 104 formed in the periphery of the chip region 102 as shown in FIG. 1. Note that FIG. 10 is a cross-sectional view taken along line A-A' of FIG. 2A. In FIG. 10, the same elements as those of the semiconductor device of the first embodiment shown in FIG. 3 are denoted with the same reference numerals and description thereof will be omitted as appropriate.

This modification is different from the first embodiment in the following points: as shown in FIG. 10, an end portion of the first passivation film 109 located on the opposite side to the chip region 102 when viewed from the opening 131 is not aligned with an end portion of the second passivation film 150 located on the opposite side to the chip region 102 when viewed from the opening 161. In other words, the end portion of the first passivation film 109 in the scribe region 103 is not aligned with the end portion of the second passivation film 150 in the scribe region 103. As shown in FIG. 10, the end portion of the first passivation film 109 in the scribe region 103 is located under the second passivation film 150 in the scribe region 103. In other words, the first passivation film 109 in the scribe region 103 is covered by the second passivation film 150 in the scribe region 103.

In this modification, as in the first embodiment, the surface of the second interlayer insulating film 107 is exposed in the opening 131 and the second passivation film 150 having the opening 161 above the opening 131 is formed on the first passivation film 109, as shown in FIG. 10.

Hereinafter, a method for manufacturing a semiconductor device having the structure of FIG. 10 according to this modification will be described. Note that the steps described below are basically performed on a wafer before dicing.

First, the steps of the first embodiment shown in FIGS. 4A, 4B, 4C, 5A, 5B, and 6A are conducted. As shown in FIG. 10, a second passivation film 150 is then deposited over the whole surface of the substrate 101. More specifically, a second passivation film 150 is deposited on the first passivation film 109 including the opening 131 and on the cap layer 125 as a protective film for the cap layer 125, the pad 90 (see FIG. 2B), and the top layer wiring 75 (see FIG. 2C). For example, a single layer structure of a SiN film is used as the second passivation film 150. An opening 161 is then formed in the second passivation film 150 by a lithography method and a dry etching method so as to extend over the opening 131 in the first passivation film 109 and over the cap layer 125. In this modification, the opening 161 is formed so that the end portion of the first passivation film 109 located on the opposite side to the chip region 102 when viewed from the opening 131 is covered by the second passivation film 150 located on the same side. In other words, the opening 161 is formed so that the end portion of the first passivation film 109 in the scribe region 103 is covered by the second passivation film 150 in the scribe region 103. The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

This modification has the following effects in addition to the effects of the first embodiment: the end portion of the first passivation film 109 located on the opposite side to the chip region 102 when viewed from the opening 131 is not aligned with the end portion of the second passivation film 150 located on the opposite side to the chip region 102 when viewed from the opening 161. In other words, the end portion of the first passivation film 109 in the scribe region 103 is not aligned with the end portion of the second passivation film 150 in the scribe region 103. Therefore, etching of the second passivation film 150 that is formed with a uniform thickness and a smooth surface in order to cover the top layer wiring 75 (see FIG. 2C) and the like can be easily conducted.

In this modification, in the case where a groove is formed in the exposed portion of the interlayer insulating film 107 in the opening 131, a transmission path of the impact, stress, and the like from the outside of the chip region 102 toward the inside of the chip region 102 in the dicing process of the wafer can be blocked. Therefore, degradation in reliability and moisture resistance of the semiconductor device can be more reliably prevented.

(Second Embodiment)

Hereinafter, a semiconductor device and a manufacturing method thereof according to a second embodiment of the invention will be described with reference to the figures.

Figure 11:
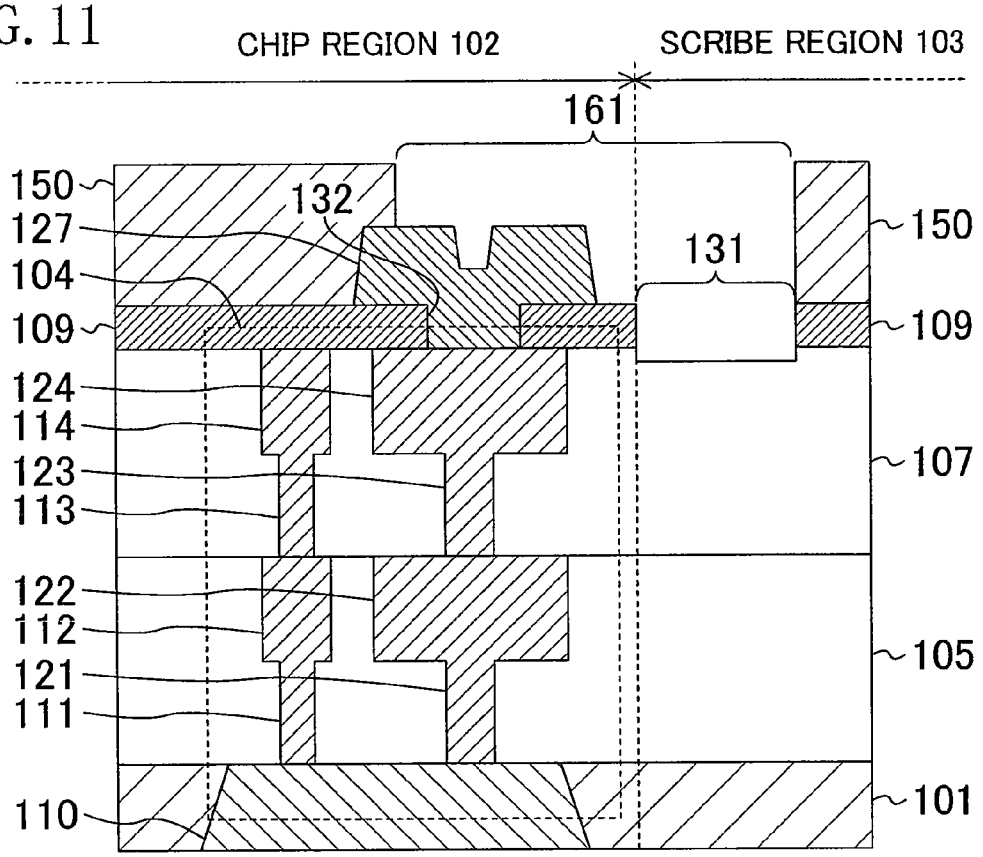
FIG. 11 shows a cross-sectional structure of an end portion of a semiconductor device according to a second embodiment of the invention.

FIG. 11 shows a cross-sectional structure of an end portion of a semiconductor device (more specifically, a diced chip) according to the second embodiment. More specifically, FIG. 11 shows a cross-sectional structure of an end portion of a semiconductor device including a seal ring 104 formed in the periphery of the chip region 102 as shown in FIG. 1. FIG. 11 is a cross-sectional view taken along line A-A' in FIG. 2A. In FIG. 11, the same elements as those of the semiconductor device of the first embodiment shown in FIG. 3 are denoted with the same reference numerals and description thereof will be omitted as appropriate.

This embodiment is different from the first embodiment in the following points: as shown in FIG. 11, the first passivation film 109 has an opening 132 in addition to the opening 131 located outside the seal ring 104 when viewed from the chip region 102. The opening 132 is located on the second seal wiring 124 formed in the top portion of the seal ring 104. A cap layer 127 connecting to the seal ring 104 (more specifically, the seal wiring 124) is formed in the opening 132.

In this embodiment, as in the first embodiment, the surface of the second interlayer insulating film 107 is exposed in the opening 131 and the second passivation film 150 having an opening 161 above the opening 131 and the cap layer 127 is formed on the first passivation film 109, as shown in FIG. 11.

In this embodiment, a groove is formed in the exposed portion of the second interlayer insulating film 107 in the opening 131, as shown in FIG. 11.

Hereinafter, a method for manufacturing a semiconductor device having the structure of FIG. 11 according to this embodiment will be described with reference to FIGS. 12A and 12B and FIGS. 13A and 13B. Note that the steps described below are basically performed on a wafer before dicing.

Figure 12A:
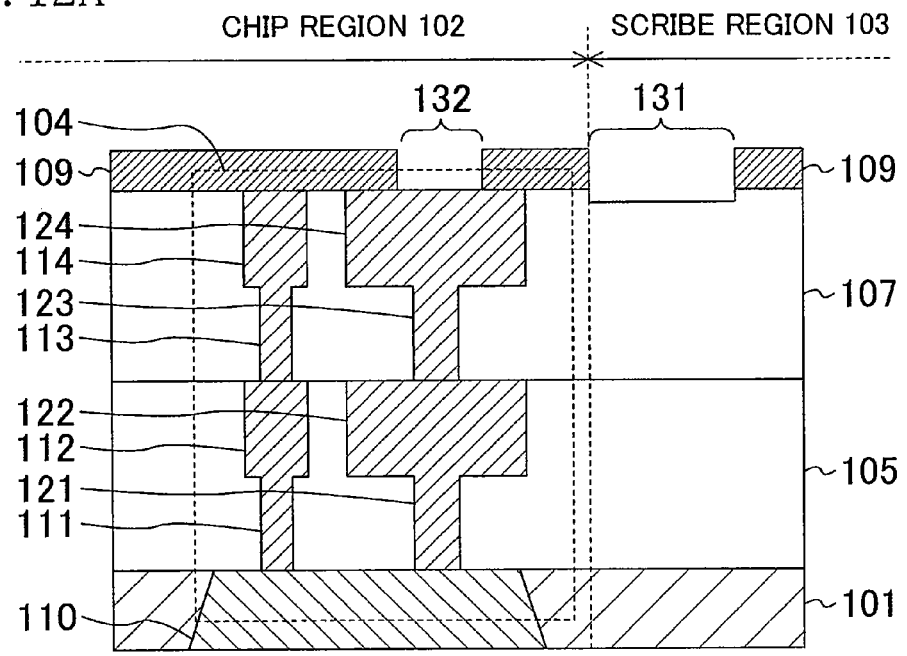
FIGS. 12A and 12B are cross-sectional views illustrating the steps of a manufacturing method of a semiconductor device according to the second embodiment of the invention.

First, the steps of the first embodiment shown in FIGS. 4A, 4B, 4C, and 5A are conducted. As shown in FIG. 12A, a first passivation film 109 is then deposited on the second interlayer insulating film 107 that is an interlayer insulating film of an uppermost layer, as a protective film for the second seal wirings 114 and 124 and the wirings 64 and 74 (see FIGS. 2B and 2C). For example, a single layer structure of a SiN film or a layered structure of a TEOS film (a lower layer) and a SiN film (an upper layer) is used as the first passivation film 109. Openings 131 and 132 are then formed in the first passivation film 109 by a lithography method and a dry etching method. The opening 131 is formed outside the seal ring 104 when viewed from the chip region 102. The opening 132 is formed only on the second seal wiring 124 in the seal ring 104. At this time, by adjusting the etching conditions for etching the first passivation film 109, the second interlayer insulating film 107 exposed in the opening 131 (located in the scribe region 103 in this embodiment) is etched so that a groove is formed in the exposed portion of the second interlayer insulating film 107. Note that the opening 131 is separated from the seal ring 104 (more specifically, the second seal wiring 124), and the first passivation film 109 is present between the openings 131 and 132. Each of the openings 131 and 132 has a groove shape continuously surrounding the chip region 102.

Figure 12B:
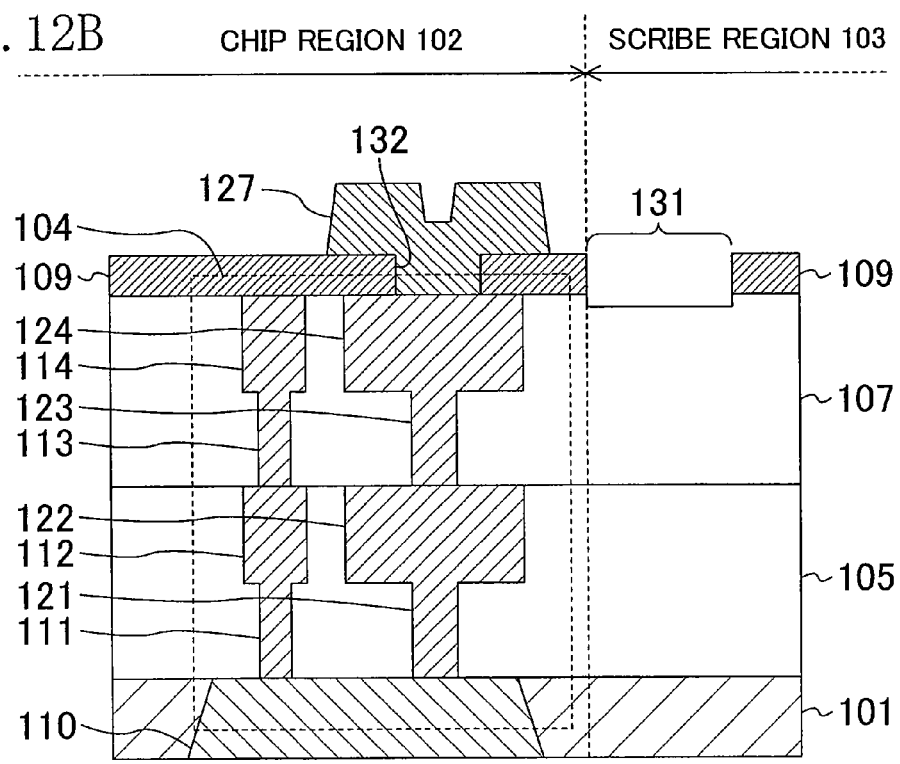

Thereafter, an Al (aluminum) film, for example, is deposited on the whole surface of the first passivation film 109 including the openings 131 and 132 by, for example, a sputtering method. The Al film is then patterned into a prescribed shape by a lithography method and a dry etching method. More specifically, an unnecessary Al film is removed from the region other than the opening 132 on the second seal wiring 124 and a portion around the opening 132. As shown in FIG. 12B, a cap layer 127 connecting to the second seal wiring 124 is thus formed in the opening 132 on the second seal wiring 124. In other words, in the seal ring formation region, that is, in the periphery of the chip region 102, the second seal wiring 114 located on the inner side of the chip region 102 in the top portion of the seal ring 104 is covered by the first passivation film 109, and the second seal wiring 124 located on the side of the scribe region 103 in the top portion of the seal ring 104 is covered by the first passivation film 109 and the cap layer 127. At this time, in the pad formation region of the chip region 102, a pad 90 connecting to the wiring 64 is formed in the opening in the first passivation film 109 as shown in FIG. 2B. In the top layer wiring formation region of the chip region 102, a top layer wiring 75 connecting to the wiring 74 is formed in the opening in the first passivation film 109 as shown in FIG. 2C. In other words, in this embodiment, the cap layer 127 connecting to the second seal wiring 124 in the top portion of the seal ring 104 is simultaneously formed in the wiring/pad formation step in the chip region 102. Therefore, the cap layer 127 connecting to the second seal wiring 124 in the top portion of the seal ring 104 can be formed without performing an additional cap layer formation step.

Figure 13A:
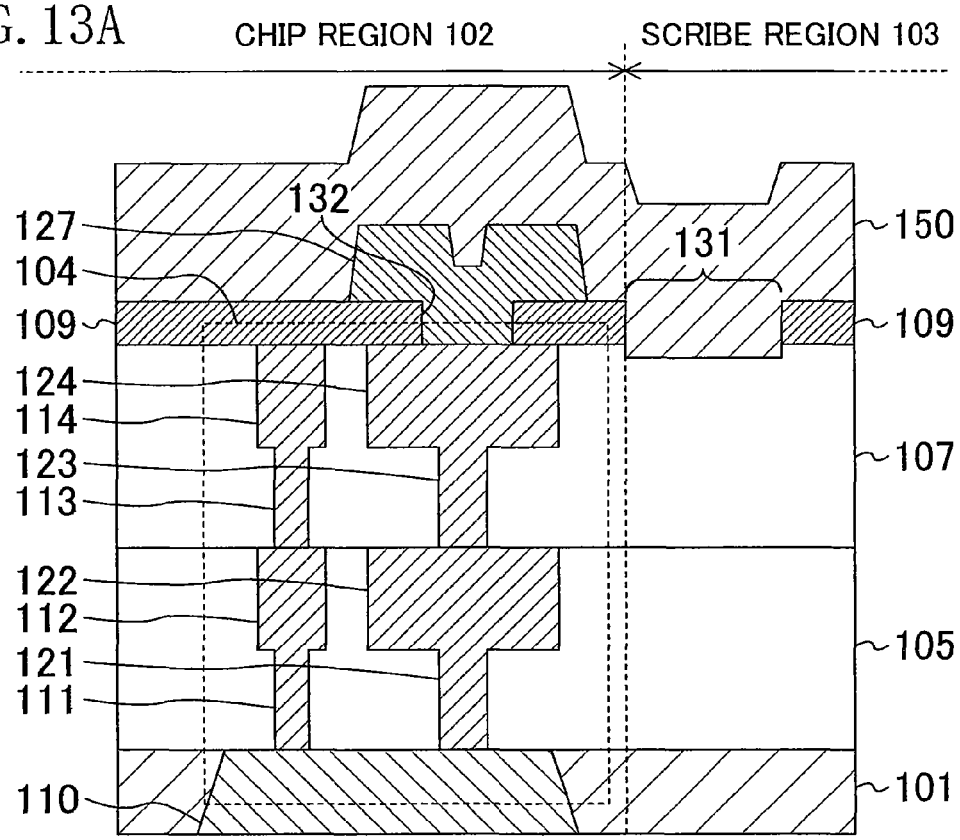
FIGS. 13A and 13B are cross-sectional views illustrating the steps of the manufacturing method of a semiconductor device according to the second embodiment of the invention.
Figure 13B:
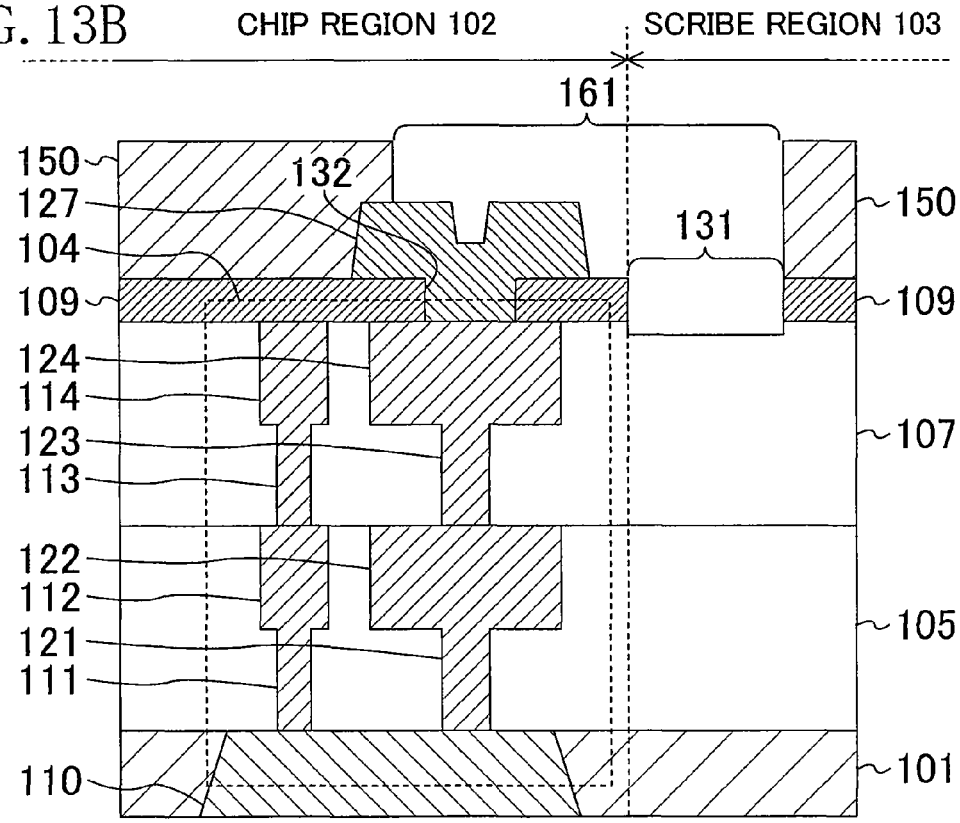

As shown in FIG. 13A, a second passivation film 150 is then deposited over the whole surface of the substrate 101. More specifically, a second passivation film 150 is deposited on the first passivation film 109 including the opening 131 and on the cap layer 127 as a protective film for the cap layer 127, the pad 90 (see FIG. 2B), and the top layer wiring 75 (see FIG. 2C). For example, a single layer structure of a SiN film is used as the second passivation film 150. As shown in FIG. 13B, an opening 161 is then formed in the second passivation film 150 by a lithography method and a dry etching method so as to extend over the opening 131 in the first passivation film 109 and over the cap layer 127. The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

As has been described above, according to this embodiment, the passivation films 109 and 150 are separated by the openings 131 and 161 in the outside of the seal ring 104 (near the periphery of the chip region 102). Therefore, even when the passivation films 109 and 150 located outside the chip region 102 (that is, the passivation films 109 and 150 in the scribe region 103) peel from the substrate 101 by the impact caused by dicing of the wafer, the passivation films 109 and 150 in the chip region 102 can be prevented from peeling from the substrate 101. In this embodiment, the second interlayer insulating film 107 is exposed in the openings 131 and 161 that separate the passivation films 109 and 150 between the inside and outside of the chip region 102. Therefore, the impact applied to the passivation films 109 and 150 outside the chip region 102 (that is, in the scribe region 103) can be more reliably prevented from transmitting through the passivation films 109 and 150 into the chip region 102, as compared to the structure in which a cap layer or the like is formed in the entire openings 131 and 161. Accordingly, chippings, cracks, and the like that are produced by dicing the wafer into individual chips can be prevented from spreading into the chip region 102, and therefore contaminants such as water and mobile ions can be prevented from entering the device through the chip surface. As a result, reliability and moisture resistance of the semiconductor device can be improved.

According to this embodiment, the opening 132 is formed in the first passivation film 109 on the second seal wiring 124 of the seal ring 104, and the cap layer 127 connecting to the second seal wiring 124 is formed in the opening 132. Therefore, transmission of impact, stress, and the like from the outside of the chip region 102 (the scribe region 103) toward the inside of the chip region 102 in the dicing process of the wafer can be blocked by the cap layer 127 and the seal ring 104 having toughness and malleability. Therefore, the passivation films 109 and 150 in the chip region 102 can be more reliably prevented from peeling from the substrate 101. As a result, reliability and moisture resistance of the semiconductor device can further be improved.

According to this embodiment, a groove is formed in the exposed portion of the second interlayer insulating film 107 in the opening 131 formed in the first passivation film 109 outside the seal ring 104. In other words, the bottom of the groove is located in the soft second interlayer insulating film 107 having relatively low hardness. Therefore, a transmission path of the impact, stress, and the like from the outside of the chip region 102 (the scribe region 103) toward the inside of the chip region 102 in the dicing process of the wafer can be blocked. Therefore, generation of cracks and the like in the passivation films 109 and 150 can be suppressed in the dicing process of the wafer, and the passivation films 109 and 150 in the chip region 102 can be prevented from peeling from the substrate 101. As a result, degradation in reliability and moisture resistance of the semiconductor device can be more reliably prevented.

In this embodiment, the opening 131 formed in the first passivation film 109 may be formed not only on the dicing residue of the scribe region 103 but also on the end portion of the chip region 102 located outside the seal ring 104. The opening 131 may alternatively be formed by not forming the passivation film 109 in the scribe region 103 in the wafer state.

In this embodiment, the seal ring 104 (more specifically, the second seal wirings 114 and 124) is covered by the passivation film 109 and the cap layer 127. Therefore, the seal ring 104 will not be corroded.

In this embodiment, a wiring structure may be formed in the interlayer insulating films 105 and 107 in the scribe region 103.

In this embodiment, it is preferable that the first passivation film 109 has a thickness of 150 nm or more in order to reliably protect the second seal wirings 114 and 124 and the wirings 64 and 74.

In this embodiment, a material of each seal wiring and each seal via of the seal ring 104 is not limited, but at least one of tungsten (W), aluminum (Al), and copper (Cu) may be used.

In this embodiment, a material of the cap layer 127 connecting to the second seal wiring 124 of the seal ring 104 is not limited. However, in the case where the cap layer 127 is made of, for example, Al, corrosion of the seal ring 104 (especially the seal ring 104 made of Cu) can be reliably prevented.

In this embodiment, a groove is formed in the exposed portion of the second interlayer insulating film 107 in the opening 131. However, this groove need not necessarily be formed. In other words, the bottom surface of the first passivation film 109 may be flush with the surface of the exposed portion of the second interlayer insulating film 107 in the opening 131.

(First Modification of the Second Embodiment)

Hereinafter, a semiconductor device and a manufacturing method thereof according to a first modification of the second embodiment of the invention will be described with reference to the figures.

Figure 14:
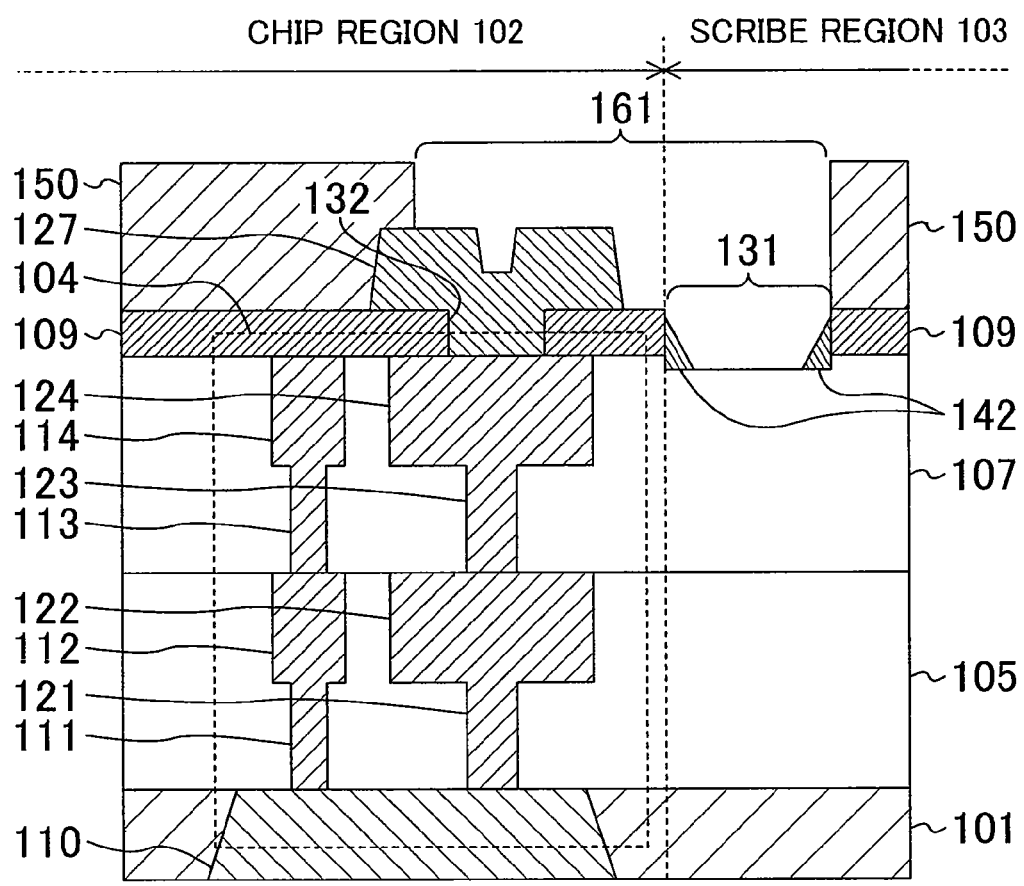
FIG. 14 shows a cross-sectional structure of an end portion of a semiconductor device according to a first modification of the second embodiment of the invention.

FIG. 14 shows a cross-sectional structure of an end portion of a semiconductor device (more specifically, a diced chip) according to this modification. More specifically, FIG. 14 shows a cross-sectional structure of an end portion of a semiconductor device including a seal ring 104 formed in the periphery of the chip region 102 as shown in FIG. 1. Note that FIG. 14 is a cross-sectional view taken along line A-A' of FIG. 2A. In FIG. 14, the same elements as those of the semiconductor device of the first embodiment shown in FIG. 3 or the second embodiment shown in FIG. 11 are denoted with the same reference numerals and description thereof will be omitted as appropriate.

This modification is different from the second embodiment shown in FIG. 11 in the following points: in this modification, as shown in FIG. 14, a sidewall spacer 142 made of the same material as that of the cap layer 127 is formed on a side surface of the first passivation film 109 formed between the openings 131 and 132. A sidewall spacer 142 is also formed on a side surface of the first passivation film 109 located on the opposite side to the chip region 102 when viewed from the opening 131. In other words, a sidewall spacer 142 is also formed on a side surface of the first passivation film 109 in the scribe region 103. Both sidewall spacers 142 are respectively formed on the side surfaces facing the opening 131. In this modification, as shown in FIG. 14, a groove is formed in the exposed portion of the second interlayer insulating film 107 in the opening 131, and the bottom surface of each sidewall spacer 142 is located lower than the bottom surface of the first passivation film 109.

In this modification, as in the first and second embodiments, the surface of the second interlayer insulating film 107 is exposed in the opening 131 and the second passivation film 150 having an opening 161 above the opening 131 and the cap layer 127 is formed on the first passivation film 109, as shown in FIG. 14.

In this modification, as in the second embodiment, the first passivation film 109 has the opening 132 in addition to the opening 131 formed outside the seal ring 104 when viewed from the chip region 102, as shown in FIG. 14. The opening 132 is formed on the second seal wiring 124 of the seal ring 104. The cap layer 127 connecting to the second seal wiring 124 is formed in the opening 132.

Hereinafter, a method for manufacturing a semiconductor device having the structure of FIG. 14 according to this modification will be described with reference to FIGS. 15A and 15B and FIGS. 16A and 16B. Note that the steps described below are basically performed on a wafer before dicing.

Figure 15A:
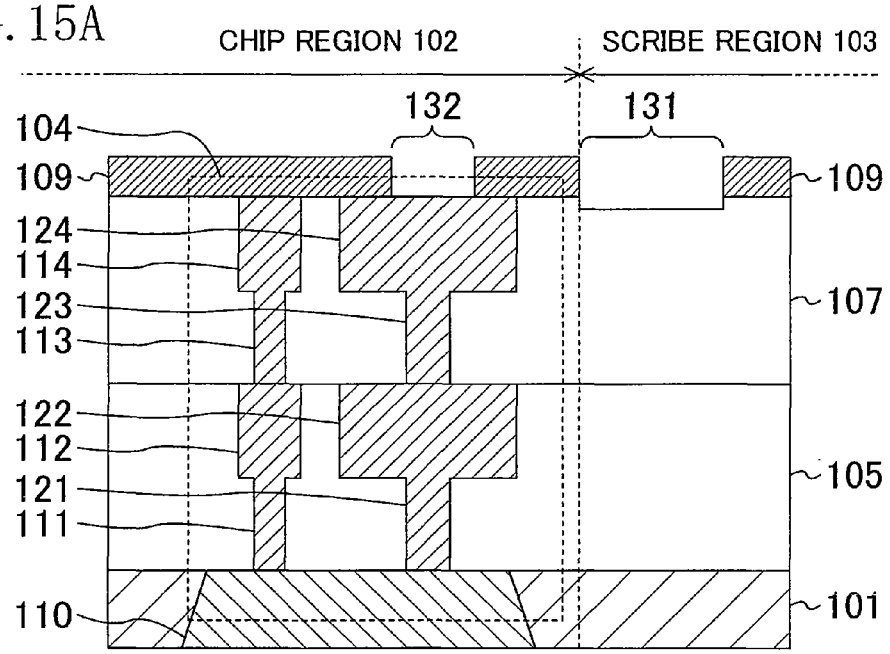
FIGS. 15A and 15B are cross-sectional views illustrating the steps of a manufacturing method of a semiconductor device according to the first modification of the second embodiment of the invention.

First, the steps of the first embodiment shown in FIGS. 4A, 4B, 4C, and 5A are conducted. As shown in FIG. 15A, a first passivation film 109 is then deposited on the second interlayer insulating film 107 that is an interlayer insulating film of an uppermost layer, as a protective film for the second seal wirings 114 and 124 and the wirings 64 and 74 (see FIGS. 2B and 2C). For example, a single layer structure of a SiN film or a layered structure of a TEOS film (a lower layer) and a SiN film (an upper layer) is used as the first passivation film 109. Openings 131 and 132 are then formed in the first passivation film 109 by a lithography method and a dry etching method. The opening 131 is formed outside the seal ring 104 when viewed from the chip region 102. The opening 132 is formed on the seal ring 104 (more specifically, on the second seal wiring 124). At this time, by adjusting the etching conditions for etching the first passivation film 109, the second interlayer insulating film 107 exposed in the opening 131 (located in the scribe region 103 in this embodiment) is etched so that a groove is formed in the exposed portion of the second interlayer insulating film 107. Note that the opening 131 is separated from the seal ring 104 (more specifically, the second seal wiring 124), and the first passivation film 109 is present between the openings 131 and 132. Each of the openings 131 and 132 has a groove shape continuously surrounding the chip region 102.

Figure 15B:
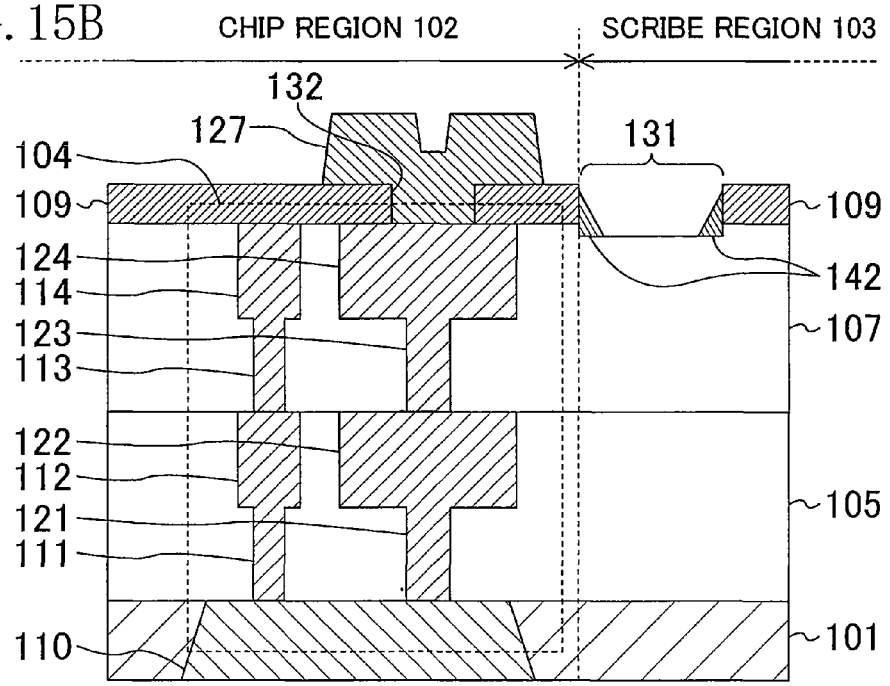

Thereafter, an Al (aluminum) film, for example, is deposited on the whole surface of the first passivation film 109 including the openings 131 and 132 by, for example, a sputtering method. The Al film is then patterned into a prescribed shape by a lithography method and a dry etching method. More specifically, an unnecessary Al film is removed from the region other than the opening 132 on the second seal wiring 124 and a portion around the opening 132. As shown in FIG. 15B, a cap layer 127 connecting to the second seal wiring 124 is thus formed in the opening 132 on the second seal wiring 124. In other words, in the seal ring formation region, that is, in the periphery of the chip region 102, the top portion of the seal ring 104 (more specifically, the second seal wiring 124) exposed in the opening 132 of the first passivation film 109 is covered by the cap layer 127. In this modification, by adjusting the etching conditions for etching the Al film to form the cap layer 127, a sidewall spacer 142 made of the same material as that of the cap layer 127 is formed on a side surface of the first passivation film 109 located between the openings 131 and 132. A sidewall spacer 142 is also formed on a side surface of the first passivation film 109 located on the opposite side of the chip region 102 when viewed from the opening 131. In other words, a sidewall spacer 142 is also formed on a side surface of the first passivation film 109 in the scribe region 103. Both sidewall spacers 142 are respectively formed on the side surfaces facing the opening 131. At this time, in the pad formation region of the chip region 102, a pad 90 connecting to the wiring 64 is formed in the opening in the first passivation film 109 as shown in FIG. 2B. In the top layer wiring formation region of the chip region 102, a top layer wiring 75 connecting to the wiring 74 is formed in the opening in the first passivation film 109 as shown in FIG. 2C. In other words, in this embodiment, the cap layer 127 connecting to the second seal wiring 124 in the top portion of the seal ring 104 is simultaneously formed in the wiring/pad formation step in the chip region 102. Therefore, the cap layer 127 connecting to the second seal wiring 124 in the top portion of the seal ring 104 can be formed without performing an additional cap layer formation step.

Figure 16A:
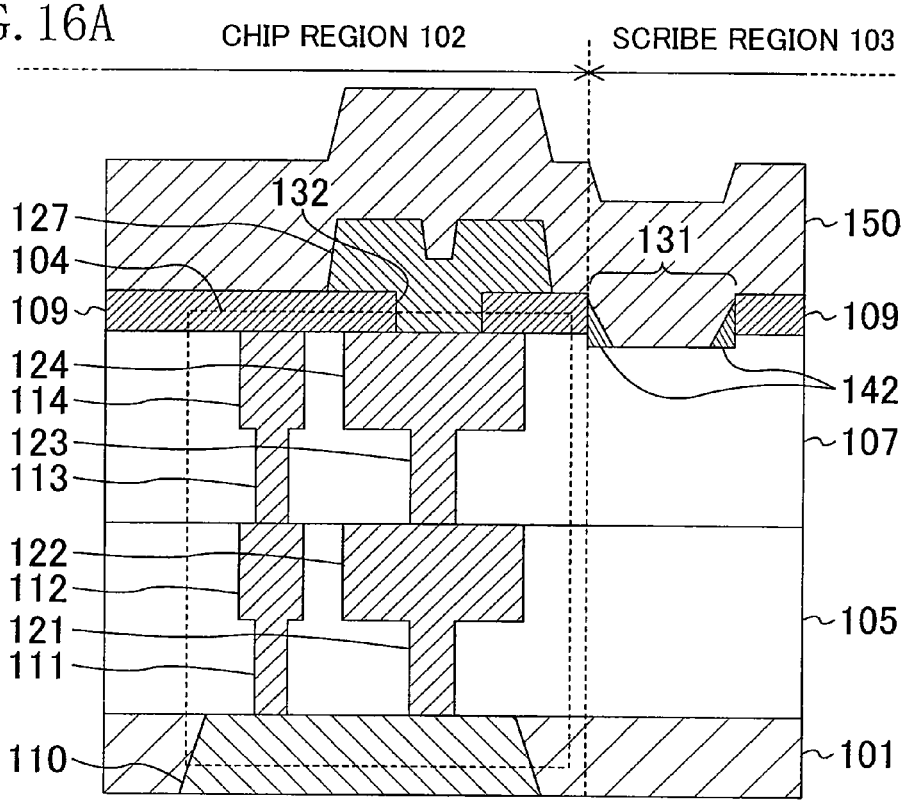
FIGS. 16A and 16B are cross-sectional views illustrating the steps of the manufacturing method of a semiconductor device according to the first modification of the second embodiment of the invention.
Figure 16B:
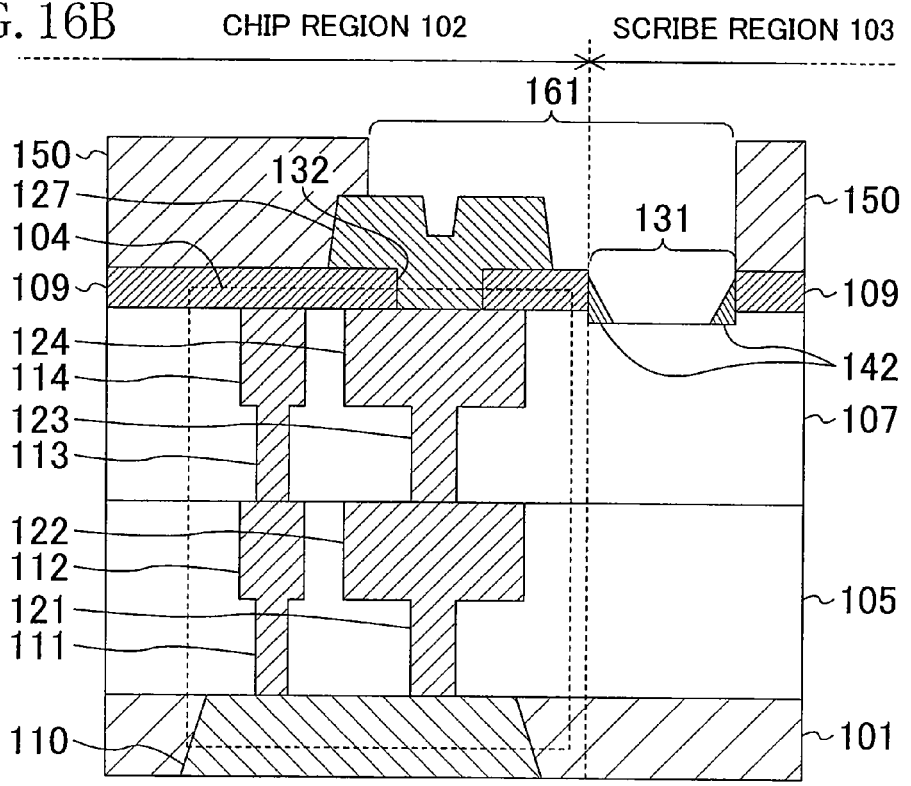

As shown in FIG. 16A, a second passivation film 150 is then deposited over the whole surface of the substrate 101. More specifically, a second passivation film 150 is deposited on the first passivation film 109 including the sidewall spacers 142 and the opening 131 and on the cap layer 127 as a protective film for the cap layer 127, the pad 90 (see FIG. 2B), and the top layer wiring 75 (see FIG. 2C). For example, a single layer structure of a SiN film is used as the second passivation film 150. As shown in FIG. 16B, an opening 161 is then formed in the second passivation film 150 by a lithography method and a dry etching method so as to extend over the opening 131 in the first passivation film 109 and over the cap layer 127. The opening 161 of the second passivation film 150 and the opening 131 of the first passivation film 109 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

This modification has the following effects in addition to the effects of the second embodiment: the sidewall spacer 142 made of the same material as that of the cap layer 127 is formed on the side surface of the first passivation film 109 located between the opening 131 and 132 (the side surface facing the opening 131). Therefore, stress generated by the impact caused by dicing of the wafer can be prevented from being intensively applied to the side surface of the first passivation film 109 in the chip region 102 (the side surface facing the opening 131). Accordingly, the first passivation film 109 in the chip region 102 can be more reliably prevented from peeling from the substrate 101.

According to this modification, a groove is formed in the exposed portion of the second interlayer insulating film 107 in the opening 131. However, this groove need not necessarily be formed. More specifically, the bottom surface of the first passivation film 109 may be flush with the surface of the exposed portion of the second interlayer insulating film 107 in the opening 131. In other words, the bottom surface of the first passivation film 109 may be flush with the bottom surface of the sidewall spacers 142.

(Second Modification of the Second Embodiment)

Hereinafter, a semiconductor device and a manufacturing method thereof according to a second modification of the second embodiment of the invention will be described with reference to the figures.

Figure 17:
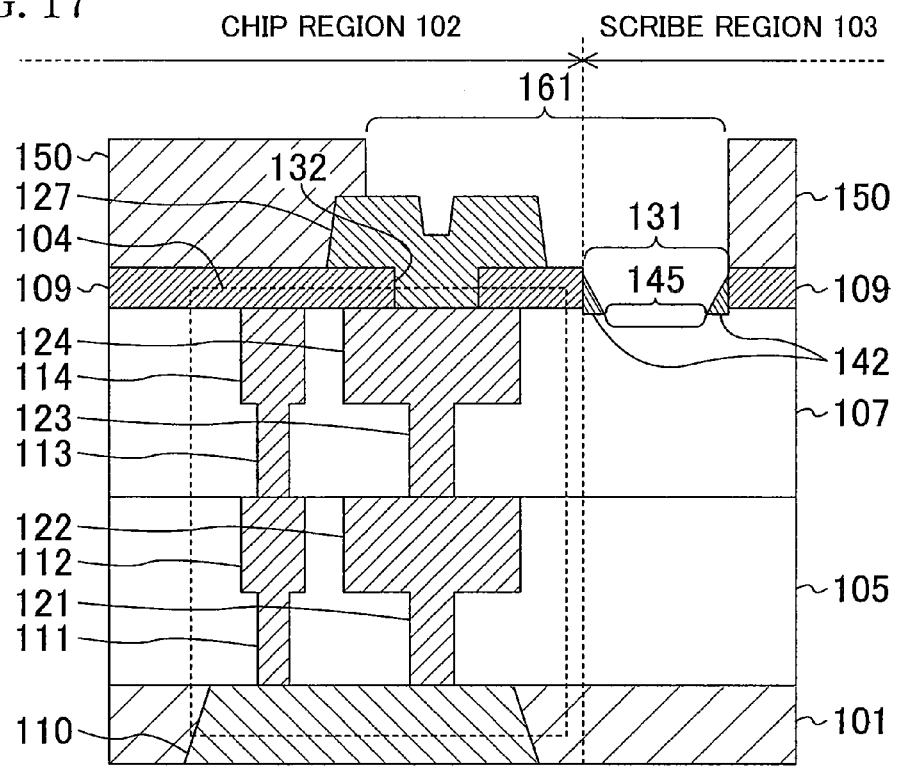
FIG. 17 shows a cross-sectional structure of an end portion of a semiconductor device according to a second modification of the second embodiment of the invention.

FIG. 17 shows a cross-sectional structure of an end portion of a semiconductor device (more specifically, a diced chip) according to this modification. More specifically, FIG. 17 shows a cross-sectional structure of an end portion of a semiconductor device including a seal ring 104 formed in the periphery of the chip region 102 as shown in FIG. 1. Note that FIG. 17 is a cross-sectional view taken along line A-A' of FIG. 2A. In FIG. 17, the same elements as those of the semiconductor device of the first embodiment shown in FIG. 3 or the second embodiment or its first modification shown in FIG. 11 or 14 are denoted with the same reference numerals and description thereof will be omitted as appropriate.

This modification is different from the first modification of the second embodiment shown in FIG. 14 in that, as shown in FIG. 17, a groove 145 is formed in the exposed portion of the second interlayer insulating film 107 surrounded by the sidewall spacers 142 in the opening 131 of the first passivation film 109. Therefore, as shown in FIG. 17, the bottom surface of the groove 145, that is, the surface of the exposed portion of the second interlayer insulating film 107, is located lower than the bottom surface of the sidewall spacers 142. In this modification, as in the first modification of the second embodiment, the bottom surface of the sidewall spacers 142 is located lower than the bottom surface of the first passivation film 109, as shown in FIG. 17.

In this modification, a groove is formed in the exposed portion of the second interlayer insulating film 107 in the opening 131 by adjusting the etching conditions for etching the first passivation film 109 in the step of FIG. 15A in the first modification of the second embodiment. Moreover, a groove 145 is formed in the exposed portion of the second interlayer insulating film 107 surrounded by the sidewall spacers 142 in the opening 131 by adjusting the etching conditions for etching the second passivation film 150 in the step shown in FIG. 16B in the first modification of the second embodiment. The opening 161 of the second passivation film 150, the opening 131 of the first passivation film 109, and the groove 145 of the second interlayer insulating film 107 together form a groove continuously surrounding the chip region 102.

In this modification, as in the first and second embodiments, the surface of the second interlayer insulating film 107 is exposed in the opening 131 and the second passivation film 150 having an opening 161 above the opening 131 and the cap layer 127 is formed on the first passivation film 109, as shown in FIG. 17.

In this modification, as in the second embodiment, the first passivation film 109 has the opening 132 in addition to the opening 131 formed outside the seal ring 104 when viewed from the chip region 102, as shown in FIG. 17. The opening 132 is formed on the second seal wiring 124 of the seal ring 104. The cap layer 127 connecting to the seal ring 104 (more specifically, the second seal wiring 124) is formed in the opening 132.

This modification has the following effects in addition to the effects of the second embodiment or its first modification: the groove 145 is formed in the exposed portion of the second interlayer insulating film 107 surrounded by the sidewall spacers 142 in the opening 131 of the first passivation film 109. In other words, the bottom surface of the groove 145 is located in the soft second interlayer insulating film 107 having relatively low hardness. Therefore, a transmission path of the impact, stress, and the like from the outside of the chip region 102 (the scribe region 103) toward the inside of the chip region 102 in the dicing process of the wafer can be blocked. Therefore, generation of cracks and the like in the passivation films 109 and 150 can be suppressed in the dicing process of the wafer, and the passivation films 109 and 150 in the chip region 102 can be prevented from peeling from the substrate 101. As a result, degradation in reliability and moisture resistance of the semiconductor device can be more reliably prevented.

In this modification, a groove is formed in the exposed portion of the second interlayer insulating film 107 in the opening 131 by adjusting the etching conditions for etching the first passivation film 109 in the step of FIG. 15A in the first modification of the second embodiment. However, this groove need not necessarily be formed in this step. More specifically, the bottom surface of the first passivation film 109 may be flush with the bottom surface of the sidewall spacers 142.

(Third Embodiment)

Hereinafter, a semiconductor device and a manufacturing method thereof according to a third embodiment of the invention will be described with reference to the figures.

Figure 18:
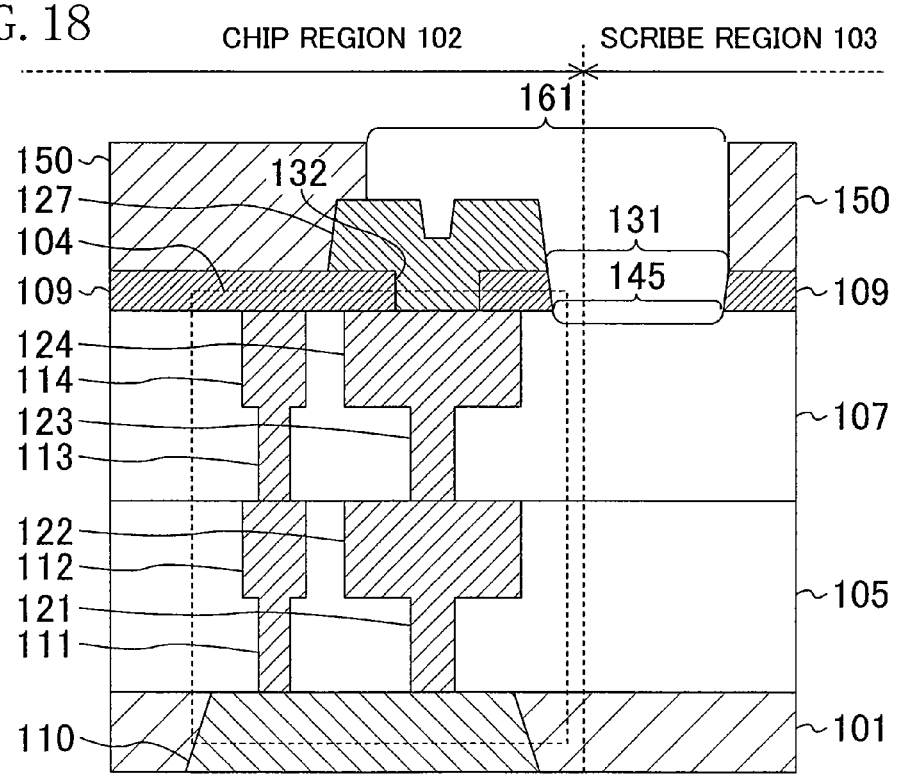
FIG. 18 shows a cross-sectional structure of an end portion of a semiconductor device according to a third embodiment of the invention.

FIG. 18 shows a cross-sectional structure of an end portion of a semiconductor device (more specifically, a diced chip) according to the third embodiment. More specifically, FIG. 18 shows a cross-sectional structure of an end portion of a semiconductor device including a seal ring 104 formed in the periphery of the chip region 102 as shown in FIG. 1. FIG. 18 is a cross-sectional view taken along line A-A' in FIG. 2A. In FIG. 18, the same elements as those of the semiconductor device of the first embodiment shown in FIG. 3 are denoted with the same reference numerals and description thereof will be omitted as appropriate.

This embodiment is different from the first embodiment in the following points: as shown in FIG. 18, the first passivation film 109 has an opening 132 in addition to the opening 131 located outside the seal ring 104 when viewed from the chip region 102. The opening 132 is located on the second seal wiring 124 of the seal ring 104. A cap layer 127 connecting to the seal ring 104 (more specifically, the seal wiring 124) is formed in the opening 132.

In this embodiment, as in the first embodiment, the surface of the second interlayer insulating film 107 is exposed in the opening 131 and the second passivation film 150 having an opening 161 above the opening 131 and the cap layer 127 is formed on the first passivation film 109, as shown in FIG. 18.

In this embodiment, a groove 145 is formed in the exposed portion of the second interlayer insulating film 107 in the opening 131, as shown in FIG. 18.

Hereinafter, a method for manufacturing a semiconductor device having the structure of FIG. 18 according to this embodiment will be described with reference to FIGS. 19A and 19B and FIGS. 20A and 20B. Note that the steps described below are basically performed on a wafer before dicing.

Figure 19A:
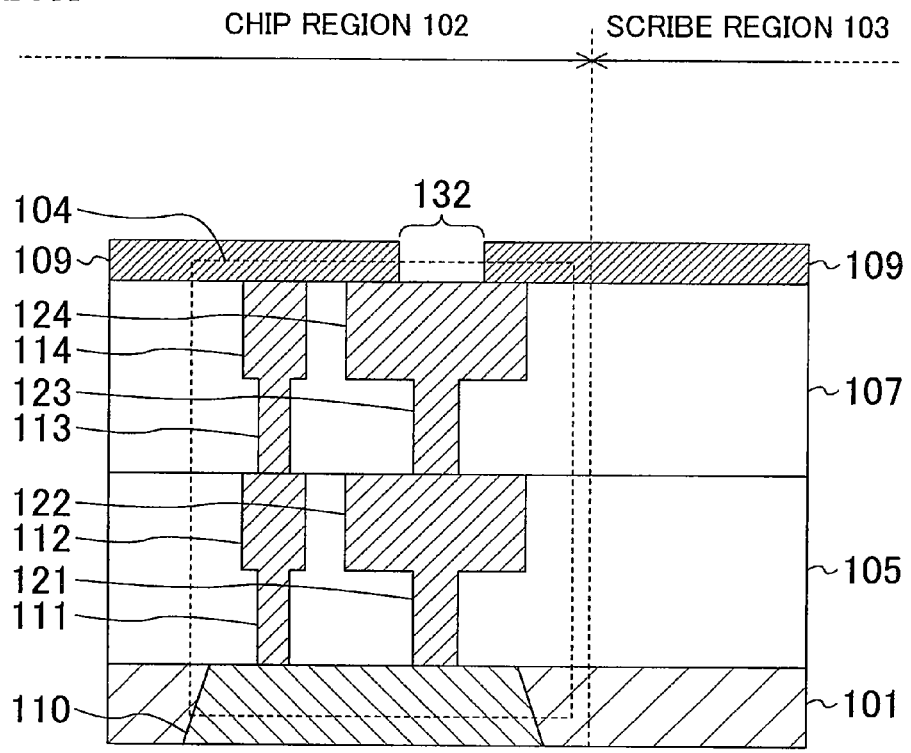
FIGS. 19A and 19B are cross-sectional views illustrating the steps of a manufacturing method of a semiconductor device according to the third embodiment of the invention.

First, the steps of the first embodiment shown in FIGS. 4A, 4B, 4C, and 5A are conducted. As shown in FIG. 19A, a first passivation film 109 is then deposited on the second interlayer insulating film 107 that is an interlayer insulating film of an uppermost layer, as a protective film for the second seal wirings 114 and 124 and the wirings 64 and 74 (see FIGS. 2B and 2C). For example, a single layer structure of a SiN film or a layered structure of a TEOS film (a lower layer) and a SiN film (an upper layer) is used as the first passivation film 109. Thereafter, only an opening 132 located above the second seal wiring 124 of the seal ring 104 is formed in the first passivation film 109 by a lithography method and a dry etching method. In other words, the opening 131 located outside the seal ring 104 when viewed from the chip region 102 is not formed at this time. Note that the opening 132 has a groove shape continuously surrounding the chip region 102.

Figure 19B:
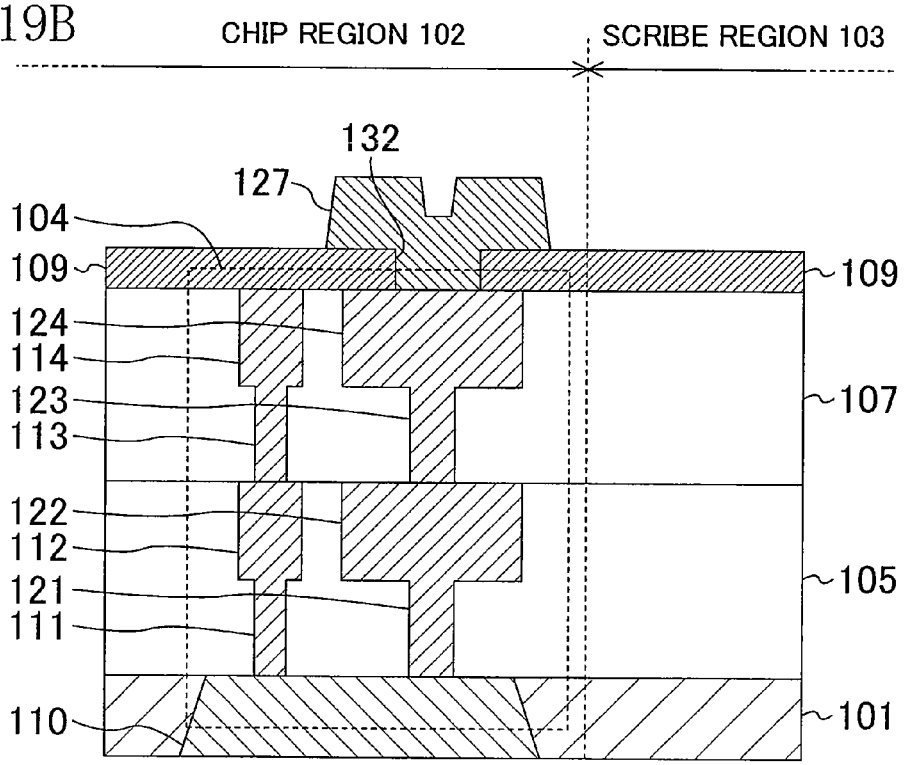

Thereafter, an Al (aluminum) film, for example, is deposited on the whole surface of the first passivation film 109 including the opening 132 by, for example, a sputtering method. The Al film is then patterned into a prescribed shape by a lithography method and a dry etching method. More specifically, an unnecessary Al film is removed from the region other than the opening 132 on the second seal wiring 124 and a portion around the opening 132. As shown in FIG. 19B, a cap layer 127 connecting to the second seal wiring 124 is thus formed in the opening 132 on the second seal wiring 124. In other words, in the seal ring formation region, that is, in the periphery of the chip region 102, the top portion of the seal ring 104 exposed in the opening 132 of the first passivation film 109 (more specifically, the second seal wiring 124) is covered by the cap layer 127. At this time, in the pad formation region of the chip region 102, a pad 90 connecting to the wiring 64 is formed in the opening in the first passivation film 109 as shown in FIG. 2B. In the top layer wiring formation region of the chip region 102, a top layer wiring 75 connecting to the wiring 74 is formed in the opening in the first passivation film 109 as shown in FIG. 2C. In other words, in this embodiment, the cap layer 127 connecting to the second seal wiring 124 in the top portion of the seal ring 104 is simultaneously formed in the wiring/pad formation step in the chip region 102. Therefore, the cap layer 127 connecting to the second seal wiring 124 in the top portion of the seal ring 104 can be formed without performing an additional cap layer formation step.

Figure 20A:
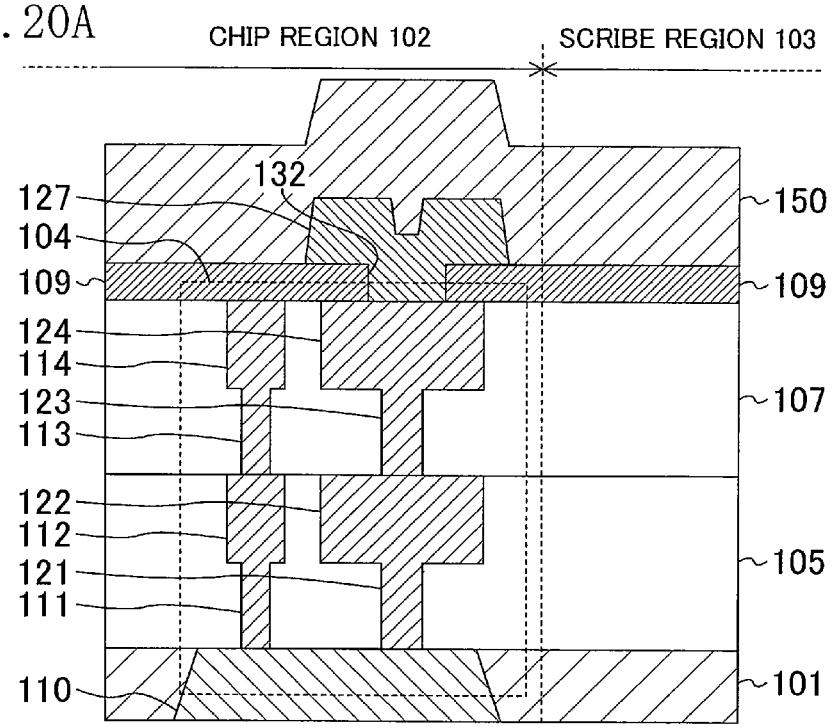
FIGS. 20A and 20B are cross-sectional views illustrating the steps of the manufacturing method of a semiconductor device according to the third embodiment of the invention.
Figure 20B:
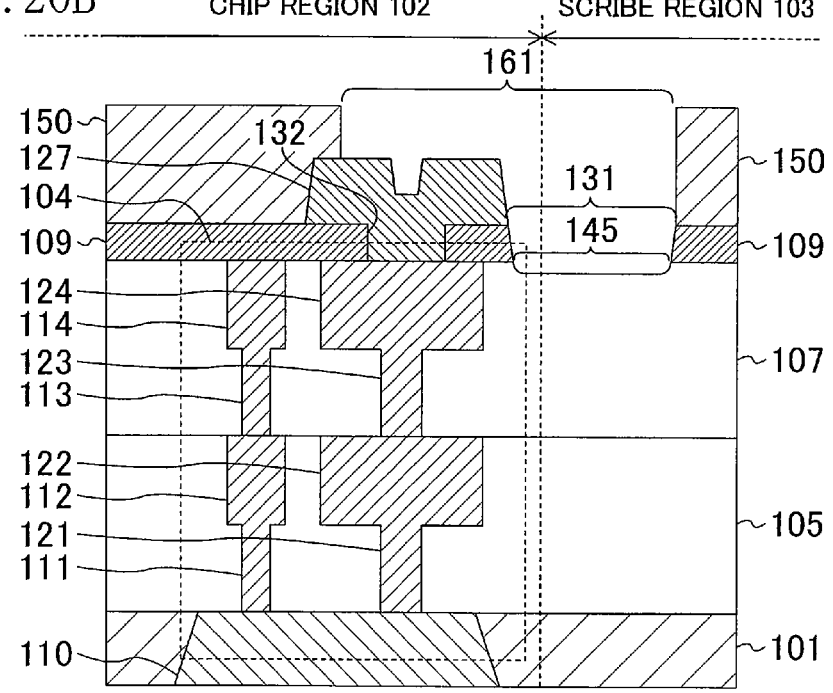

As shown in FIG. 20A, a second passivation film 150 is then deposited over the whole surface of the substrate 101. More specifically, a second passivation film 150 is deposited on the first passivation film 109 and the cap layer 127 as a protective film for the cap layer 127, the pad 90 (see FIG. 2B), and the top layer wiring 75 (see FIG. 2C). For example, a single layer structure of a SiN film is used as the second passivation film 150. As shown in FIG. 20B, an opening 161 is then formed in the second passivation film 150 by a lithography method and a dry etching method. The opening 161 extends from a position outside the seal ring 104 when viewed from the chip region 102 to a position on the cap layer 127. At this time, by adjusting the etching conditions for etching the second passivation film 150, the first passivation film 109 and the second interlayer insulating film 107 are sequentially etched in the region outside the seal ring 104 when viewed from the chip region 102 (that is, under the opening 161 where the cap layer 127 is not formed). As a result, in the region outside the seal ring 104 when viewed from the chip region 102, an opening 131 is formed in the first passivation film 109 as well as a groove 145 is formed in the exposed portion of the second interlayer insulating film 107 in the opening 131. The opening 161 of the second passivation film 150, the opening 131 of the first passivation film 109, and the groove 145 of the second interlayer insulating film 107 together form a groove continuously surrounding the chip region 102. At this time, in the pad formation region of the chip region 102, an opening is formed in the second passivation film 150 on the pad 90, as shown in FIG. 2B. In the top layer wiring formation region of the chip region 102, however, the top layer wiring 75 is kept covered by the second passivation film 150, as shown in FIG. 2C.

As has been described above, according to this embodiment, the passivation films 109 and 150 are separated by the openings 131 and 161 in the outside of the seal ring 104 (near the periphery of the chip region 102). Therefore, even when the passivation films 109 and 150 located outside the chip region 102 (that is, the passivation films 109 and 150 in the scribe region 103) peel from the substrate 101 by the impact caused by dicing of the wafer, the passivation films 109 and 150 in the chip region 102 can be prevented from peeling from the substrate 101. In this embodiment, the second interlayer insulating film 107 is exposed in the openings 131 and 161 that separate the passivation films 109 and 150 between the inside and outside of the chip region 102. Therefore, the impact applied to the passivation films 109 and 150 outside the chip region 102 (that is, in the scribe region 103) can be more reliably prevented from transmitting through the passivation films 109 and 150 into the chip region 102, as compared to the structure in which a cap layer or the like is formed in the entire openings 131 and 161. Accordingly, chippings, cracks, and the like that are produced by dicing the wafer into individual chips can be prevented from spreading into the chip region 102, and therefore contaminants such as water and mobile ions can be prevented from entering the device through the chip surface. As a result, reliability and moisture resistance of the semiconductor device can be improved.

According to this embodiment, the opening 132 is formed in the first passivation film 109 on the seal ring 104, and the cap layer 127 connecting to the seal ring 104 is formed in the opening 132. Therefore, transmission of impact, stress, and the like from the outside of the chip region 102 (the scribe region 103) toward the inside of the chip region 102 in the dicing process of the wafer can be blocked by the cap layer 127 and the seal ring 104 having toughness and malleability. Therefore, the passivation films 109 and 150 in the chip region 102 can be more reliably prevented from peeling from the substrate 101. As a result, reliability and moisture resistance of the semiconductor device can further be improved.

According to this embodiment, the groove 145 is formed in the exposed portion of the second interlayer insulating film 107 in the opening 131 formed in the first passivation film 109 outside the seal ring 104. In other words, the bottom surface of the groove 145 is located in the soft second interlayer insulating film 107 having relatively low hardness. Therefore, a transmission path of the impact, stress, and the like from the outside of the chip region 102 (the scribe region 103) toward the inside of the chip region 102 in the dicing process of the wafer can be blocked. Therefore, generation of cracks and the like in the passivation films 109 and 150 can be suppressed in the dicing process of the wafer, and the passivation films 109 and 150 in the chip region 102 can be prevented from peeling from the substrate 101. As a result, degradation in reliability and moisture resistance of the semiconductor device can be more reliably prevented.

In this embodiment, the opening 131 formed in the first passivation film 109 may be formed not only on the end portion of the chip region 102 located outside the seal ring 104 but also on the dicing residue of the scribe region 103. The opening 131 may alternatively be formed by not forming the passivation film 109 in the scribe region 103 in the wafer state.

In this embodiment, the seal ring 104 (more specifically, the second seal wirings 114 and 124) is covered by the passivation film 109 and the cap layer 127. Therefore, the seal ring 104 will not be corroded.

In this embodiment, a wiring structure may be formed in the interlayer insulating films 105 and 107 in the scribe region 103.

In this embodiment, it is preferable that the first passivation film 109 has a thickness of 150 nm or more in order to reliably protect the second seal wirings 114 and 124 and the wirings 64 and 74.

In this embodiment, a material of each seal wiring and each seal via of the seal ring 104 is not limited, but at least one of tungsten (W), aluminum (Al), and copper (Cu) may be used.

In this embodiment, a material of the cap layer 127 connecting to the seal ring 104 is not limited. However, in the case where the cap layer 127 is made of, for example, Al, corrosion of the seal ring 104 (especially the seal ring 104 made of Cu) can be reliably prevented.

In this embodiment, the groove 145 is formed in the exposed portion of the second interlayer insulating film 107 in the opening 131. However, this groove 145 need not necessarily be formed. In other words, the bottom surface of the first passivation film 109 may be flush with the surface of the exposed portion of the second interlayer insulating film 107 in the opening 131.

(Modification of the Third Embodiment)

Hereinafter, a semiconductor device and a manufacturing method thereof according to a modification of the third embodiment of the invention will be described with reference to the figures.

Figure 21:
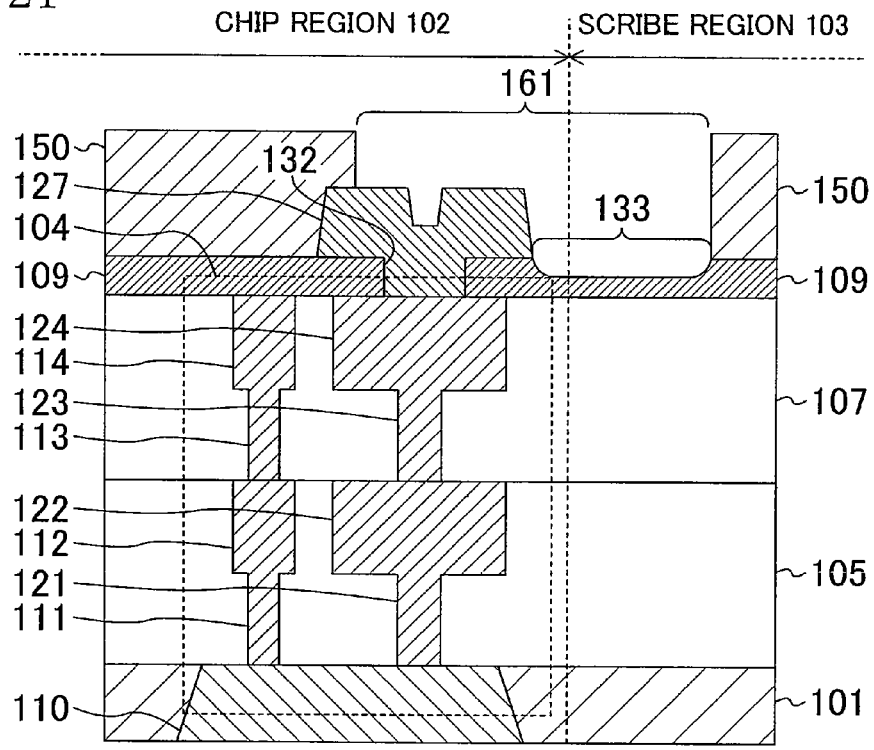
FIG. 21 shows a cross-sectional structure of an end portion of a semiconductor device according to a modification of the third embodiment of the invention.
Figure 22:
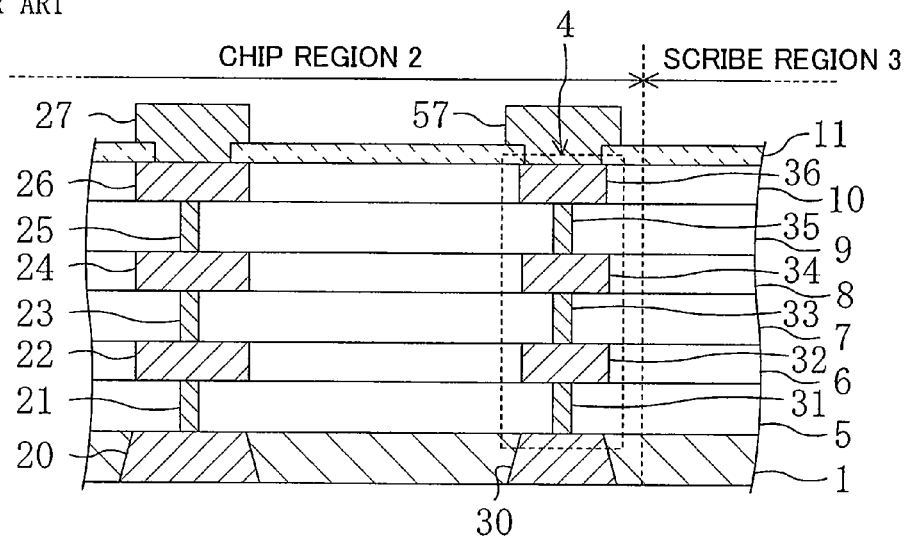
FIG. 22 is a cross-sectional view of a conventional semiconductor device.

FIG. 21 shows a cross-sectional structure of an end portion of a semiconductor device (more specifically, a diced chip) according to this modification. More specifically, FIG. 21 shows a cross-sectional structure of an end portion of a semiconductor device including a seal ring 104 formed in the periphery of the chip region 102 as shown in FIG. 1. Note that FIG. 21 is a cross-sectional view taken along line A-A' of FIG. 2A. In FIG. 21, the same elements as those of the semiconductor device of the first embodiment shown in FIG. 3 or the third embodiment shown in FIG. 18 are denoted with the same reference numerals and description thereof will be omitted as appropriate.

This modification is different from the third embodiment shown in FIG. 18 as follows: in the third embodiment shown in FIG. 18, the opening 131 is formed in the first passivation film 109 located outside the seal ring 104 when viewed from the chip region 102. In this modification shown in FIG. 21, on the other hand, the opening 131 is not formed, and the first passivation film 109 is thinned in the region outside the seal ring 104 when viewed from the chip region 102, and this thinned portion 133 is exposed.

In the semiconductor device of this modification shown in FIG. 21, the thinned portion 133 is formed by etching the first passivation film 109 to a prescribed depth in the region outside the seal ring 104 when viewed from the chip region 102 (under the opening 161 where the cap layer 127 is not formed) by adjusting the etching conditions for etching the second passivation film 150 in the step of FIG. 20B in the third embodiment. The opening 161 of the second passivation film 150 and the thinned portion 133 of the first passivation film 109 together form a groove continuously surrounding the chip region 102.

As has been described above, in this modification, the passivation film 150 is separated by the opening 161 in the region outside the seal ring 104 (near the periphery of the chip region 102). Moreover, the passivation film 109 is thinned in the region outside the seal ring 104 (near the periphery of the chip region 102). In other words, the passivation film 109 is thinned under the opening 161. Therefore, even when the passivation films 109 and 150 located outside the chip region 102 peel from the substrate 101 by the impact caused by dicing of the wafer, this peeling of the passivation films 109 and 150 can be terminated in the thinned portion 133 of the passivation film 109. Therefore, the passivation films 109 and 150 in the chip region 102 can be prevented from peeling from the substrate 101. The passivation film 109 serves as a transmission path of the impact, stress, and the like from the outside toward inside of the chip region 102 in the dicing process of the wafer. Therefore, by thinning the passivation film 109 in the region outside the seal ring 104, transmission of the impact, stress, and the like can be blocked by the thinned portion 133. Accordingly, chippings, cracks, and the like that are produced by dicing the wafer into individual chips can be prevented from spreading into the chip region 102, and therefore contaminants such as water and mobile ions can be prevented from entering the device through the chip surface. As a result, reliability and moisture resistance of the semiconductor device can be improved.

According to this modification, the first passivation film 109 has the opening 132 on the seal ring 104 and the cap layer 127 connecting to the seal ring 104 is formed in the opening 132. Therefore, transmission of impact, stress, and the like from the outside of the chip region 102 toward the inside of the chip region 102 in the dicing process of the wafer can be blocked by the cap layer 127 and the seal ring 104 having toughness and malleability. Therefore, the passivation films 109 and 150 in the chip region 102 can be more reliably prevented from peeling from the substrate 101. As a result, reliability and moisture resistance of the semiconductor device can further be improved.

In this modification, the thinned portion 133 of the passivation film 109 may be formed not only on the end portion of the chip region 102 located outside the seal ring 104 but also on the dicing residue of the scribe region 103.

What is claimed is:
1. A semiconductor device, comprising:
an interlayer insulating film formed on a substrate;
a first seal wiring formed in the interlayer insulating film in a periphery of a chip region and surrounding the chip region; and
a first protective film formed on the interlayer insulating film having the first seal wiring formed therein, wherein the first protective film is provided with a first opening such that at least a part of the first seal wiring and at least a part of the interlayer insulating film are exposed from the first protective film, the first opening includes a first region and a second region located outside the first region when viewed from the chip region, a part of the first protective film is located outside the second region when viewed from the chip region, the first region is provided with a cap layer so as to be in contact with the first seal wiring, and the second region is not provided with the cap layer and exposes the interlayer insulating film from the first protective film.

2. The semiconductor device according to claim 1, wherein a groove is formed in the exposed portion of the interlayer insulating film.

3. The semiconductor device according to claim 1, wherein the first region and the second region are located adjacent to each other.

4. The semiconductor device according to claim 1, wherein a second opening is formed in the first protective film in a region on the seal ring, and a cap layer connecting to the seal ring is formed in the second opening.

5. The semiconductor device according to claim 4, wherein a sidewall spacer made of a same material as a material of the cap layer is formed on a side surface of the first protective film located between the first opening and the second opening, the side surface of the first protective film facing the first opening.

6. The semiconductor device according to claim 5, wherein a bottom surface of the sidewall spacer is located lower than a bottom surface of the first protective film.

7. The semiconductor device according to claim 5, wherein a surface of the exposed portion of the interlayer insulating film is located lower than a bottom surface of the sidewall spacer.

8. The semiconductor device according to claim 1, wherein the cap layer is formed so as to continuously cover the first region of the first opening and the first protective film.

9. The semiconductor device according to claim 8, wherein another cap layer is formed so as to cover an end portion of the first protective film located on an opposite side to the chip region when viewed from the first opening.

10. The semiconductor device according to claim 1, wherein a wiring is formed in the interlayer insulating film in the chip region of the substrate, a pad opening is formed in the first protective film in a region on the wiring, and a pad connecting to the wiring is formed in the pad opening.

11. The semiconductor device according to claim 1, wherein a wiring is formed in the interlayer insulating film in the chip region of the substrate, a top layer wiring opening is formed in the first protective film in a region on the wiring, and a top layer wiring connecting to the wiring is formed in the top layer wiring opening.

12. The semiconductor device according to claim 11, wherein a second protective film is formed on the first protective film so as to cover the top layer wiring, and a third opening is formed in the second protective film in a region above the first opening.

13. The semiconductor device according to claim 12, wherein an end portion of the first protective film located on an opposite side to the chip region when viewed from the first opening is not aligned with an end portion of the second protective film located on an opposite side to the chip region when viewed from the third opening.

14. The semiconductor device according to claim 13, wherein the end portion of the second protective film located on the opposite side to the chip region when viewed from the third opening is located above the first protective film located on the opposite side to the chip region when viewed from the first opening.

15. The semiconductor device according to claim 13, wherein the end portion of the first protective film located on the opposite side to the chip region when viewed from the first opening is located under the second protective film located on the opposite side to the chip region when viewed from the third opening.

16. The semiconductor device according to claim 1, wherein the first protective film has a thickness of at least 150 nm.

17. The semiconductor device according to claim 1, wherein
the second region is located outside the first seal wiring when viewed from the chip region.

18. The semiconductor device according to claim 1, wherein
the first protective film includes a SiN film.

19. The semiconductor device according to claim 1, wherein
the first protective film is a film having a layered structure.

20. The semiconductor device according to claim 1, wherein
the first seal wiring is made of a material including Cu, and the cap layer is made of a material including Al.

21. The semiconductor device according to claim 1, wherein
a part of the first protective film is formed so as to cover a part of the first seal wiring.

22. The semiconductor device according to claim 1, wherein
a second seal wiring surrounding the chip region is formed inside the first seal wiring when viewed from the chip region, and
the first protective film formed on the second seal wiring has no opening thereon.

23. The semiconductor device according to claim 1, wherein
an entirety of an upper surface of the first seal wiring is covered by at least one of the first protective film and the cap layer.

24. The semiconductor device according to claim 12, wherein
a part of the second protective film is formed so as to cover a part of the cap layer.

25. The semiconductor device according to claim 12, wherein
the third opening is formed so that the cap layer and the second region are exposed from the third opening.

26. The semiconductor device according to claim 1, wherein
the semiconductor device includes a semiconductor device diced from a wafer.

27. The semiconductor device according to claim 1, wherein
the second region and the part of the first protective film are located inside a scribe region of the semiconductor device diced from a wafer.

* * * * *